(12) United States Patent
Yan et al.

(10) Patent No.: US 8,374,051 B2
(45) Date of Patent: Feb. 12, 2013

(54) THREE DIMENSIONAL MEMORY SYSTEM WITH COLUMN PIPELINE

(75) Inventors: Tianhong Yan, San Jose, CA (US);
Gopinath Balakrishnan, San Jose, CA (US); Jeffrey Koon Yee Lee, Milpitas, CA (US); Tz-yi Liu, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 210 days.

(21) Appl. No.: 13/039,574

(22) Filed: Mar. 3, 2011

(65) Prior Publication Data

US 2012/0224408 A1    Sep. 6, 2012

(51) Int. Cl.
*G11C 8/00* (2006.01)
(52) U.S. Cl. .............. 365/230.06; 365/230.03; 365/191; 365/185.11; 365/185.13; 365/230.02
(58) Field of Classification Search .............. 365/230.06, 365/230.03, 191, 185.13, 230.02
See application file for complete search history.

(56) References Cited

U.S. PATENT DOCUMENTS

| | | | |
|---|---|---|---|
| 4,527,254 A | 7/1985 | Ryan | |
| 4,593,390 A | 6/1986 | Hildebrand | |
| 5,289,413 A | 2/1994 | Tsuchida | |
| 5,424,997 A | 6/1995 | Rapp | |
| 5,541,869 A | 7/1996 | Rose | |
| 5,592,435 A | 1/1997 | Mills | |
| 5,784,705 A | 7/1998 | Lueng | |
| 5,901,086 A | 5/1999 | Wang | |
| 5,915,167 A | 6/1999 | Leedy | |
| 5,969,986 A | 10/1999 | Wong | |
| 6,034,882 A | 3/2000 | Johnson | |
| 6,072,716 A | 6/2000 | Jacobson | |
| 6,134,145 A | 10/2000 | Wong | |
| 6,420,215 B1 | 7/2002 | Knall | |
| 6,473,332 B1 | 10/2002 | Ignatiev | |
| 6,525,953 B1 | 2/2003 | Johnson | |
| 6,661,730 B1 | 12/2003 | Scheuerlein | |
| 6,737,675 B2 | 5/2004 | Patel | |

(Continued)

OTHER PUBLICATIONS

PCT International Search Report dated May 11, 2012, PCT Patent Application PCT/US2012/025171.

(Continued)

*Primary Examiner* — Thong Q Le
(74) *Attorney, Agent, or Firm* — Vierra Magen Marcus & DeNiro LLP

(57) ABSTRACT

A monolithic three dimensional array of non-volatile storage elements is arranged in blocks. The non-volatile storage elements are connected to bit lines and word lines. The bit lines for each block are grouped into columns of bit lines. The columns of bit lines include top columns of bit lines that are connected to selection circuits on a top side of a respective block and bottom columns of bit lines that are connected to selection circuits on a bottom side of the respective block. Programming of data is pipelined between two or more columns of bit lines in order to increase programming speed. One embodiment of the programming process includes selectively connecting two columns of bit lines to a set of one or more selection circuits, using the one or more selection circuits to selectively connect one of the two columns of bit lines to one or more signal sources, programming non-volatile storage elements for the column of bit lines that is currently connected to the one or more signal sources, and changing one of the columns of bit lines connected to the set of one or more selection circuits while another column of bit lines is being programmed.

24 Claims, 18 Drawing Sheets

U.S. PATENT DOCUMENTS

| | | | |
|---|---|---|---|
| 6,856,572 | B2 | 2/2005 | Scheuerlein |
| 6,879,505 | B2 | 4/2005 | Scheuerlein |
| 6,888,750 | B2 * | 5/2005 | Walker et al. ............ 365/185.05 |
| 6,951,780 | B1 | 10/2005 | Herner |
| 6,952,030 | B2 | 10/2005 | Herner |
| 6,952,043 | B2 | 10/2005 | Vyvoda |
| 7,002,825 | B2 | 2/2006 | Scheuerlein |
| 7,081,377 | B2 | 7/2006 | Cleeves |
| 7,106,652 | B2 | 9/2006 | Scheuerlein |
| 7,176,064 | B2 | 2/2007 | Herner |
| 7,177,169 | B2 | 2/2007 | Scheuerlein |
| 7,243,203 | B2 | 7/2007 | Scheuerlein |
| 7,254,690 | B2 | 8/2007 | Rao |
| 7,272,052 | B2 | 9/2007 | Scheuerlein |
| 7,286,439 | B2 | 10/2007 | Fasoli |
| 7,298,665 | B2 | 11/2007 | So |
| 7,359,279 | B2 | 4/2008 | Fasoli |
| 7,383,476 | B2 | 6/2008 | Crowley |
| 7,542,338 | B2 | 6/2009 | Scheuerlein |
| 7,570,523 | B2 | 8/2009 | Scheuerlein |
| 7,633,828 | B2 | 12/2009 | Scheuerlein |
| 7,684,245 | B2 | 3/2010 | Schumann |
| 7,745,265 | B2 | 6/2010 | Mokhlesi |
| 7,808,038 | B2 | 10/2010 | Mokhlesi |
| 7,851,851 | B2 | 12/2010 | Mokhlesi |
| 7,869,258 | B2 | 1/2011 | Scheuerlein |
| 2003/0045054 | A1 | 3/2003 | Campbell |
| 2003/0047765 | A1 | 3/2003 | Campbell |
| 2006/0087005 | A1 | 4/2006 | Herner |
| 2006/0250836 | A1 | 11/2006 | Herner |
| 2007/0008785 | A1 | 1/2007 | Scheuerlein |
| 2007/0072360 | A1 | 3/2007 | Kumar |
| 2007/0190722 | A1 | 8/2007 | Herner |
| 2008/0010429 | A1 | 1/2008 | Rao |
| 2008/0159053 | A1 | 7/2008 | Yan |
| 2009/0001343 | A1 | 1/2009 | Schricker |
| 2009/0323391 | A1 | 12/2009 | Scheuerlein |
| 2009/0323393 | A1 | 12/2009 | Scheuerlein |
| 2010/0046267 | A1 | 2/2010 | Yan |
| 2010/0085822 | A1 | 4/2010 | Yan |
| 2010/0246250 | A1 | 9/2010 | Chen |
| 2010/0265750 | A1 | 10/2010 | Yan |
| 2010/0290286 | A1 | 11/2010 | Koya |

OTHER PUBLICATIONS

PCT Written Opinion of the International Searching Authority dated May 11, 2012, PCT Patent Application PCT/US2012/025171.
U.S. Appl. No. 13/039,581, filed Mar. 3, 2011.
U.S. Appl. No. 13/039,593, filed Mar. 3, 2011.

* cited by examiner

THREE DIMENSIONAL MEMORY SYSTEM WITH COLUMN PIPELINE

BACKGROUND

1. Field

The present invention relates to technology for data storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, consumers generally want the semiconductor memory to perform at sufficient speeds so that the memory does not slow down operation of the electronic device. Additionally, it is desirable to increase the density of storage in a memory while minimizing space used for peripheral circuitry.

DETAILED DESCRIPTION

A memory system is described herein that has an increased programming speed and efficient use of die space. To increase the programming speed, the programming is pipelined between two concurrently selected columns of bit lines. A column of bit lines is a grouping of bit lines in a block.

One embodiment includes a monolithic three dimensional array (or other structure) of non-volatile storage elements arranged in blocks. The non-volatile storage elements are connected to bit lines and word lines. The bit lines for each block are grouped into top columns of bit lines that are connected to selection circuits on a top side of a respective block and bottom columns of bit lines that are connected to selection circuits on a bottom side of the respective block.

In one embodiment, programming of data is pipelined between two or more columns of bit lines. One example implementation of the programming process includes selectively connecting two columns of bit lines to a set of one or more selection circuits, using the one or more selection circuits to selectively connect one of the two columns of bit lines to one or more signal sources, programming non-volatile storage elements for the column of bit lines that is currently connected to the one or more signal sources, and changing one of the columns of bit lines connected to the set of one or more selection circuits while another column of bit lines is being programmed.

Figure 1:
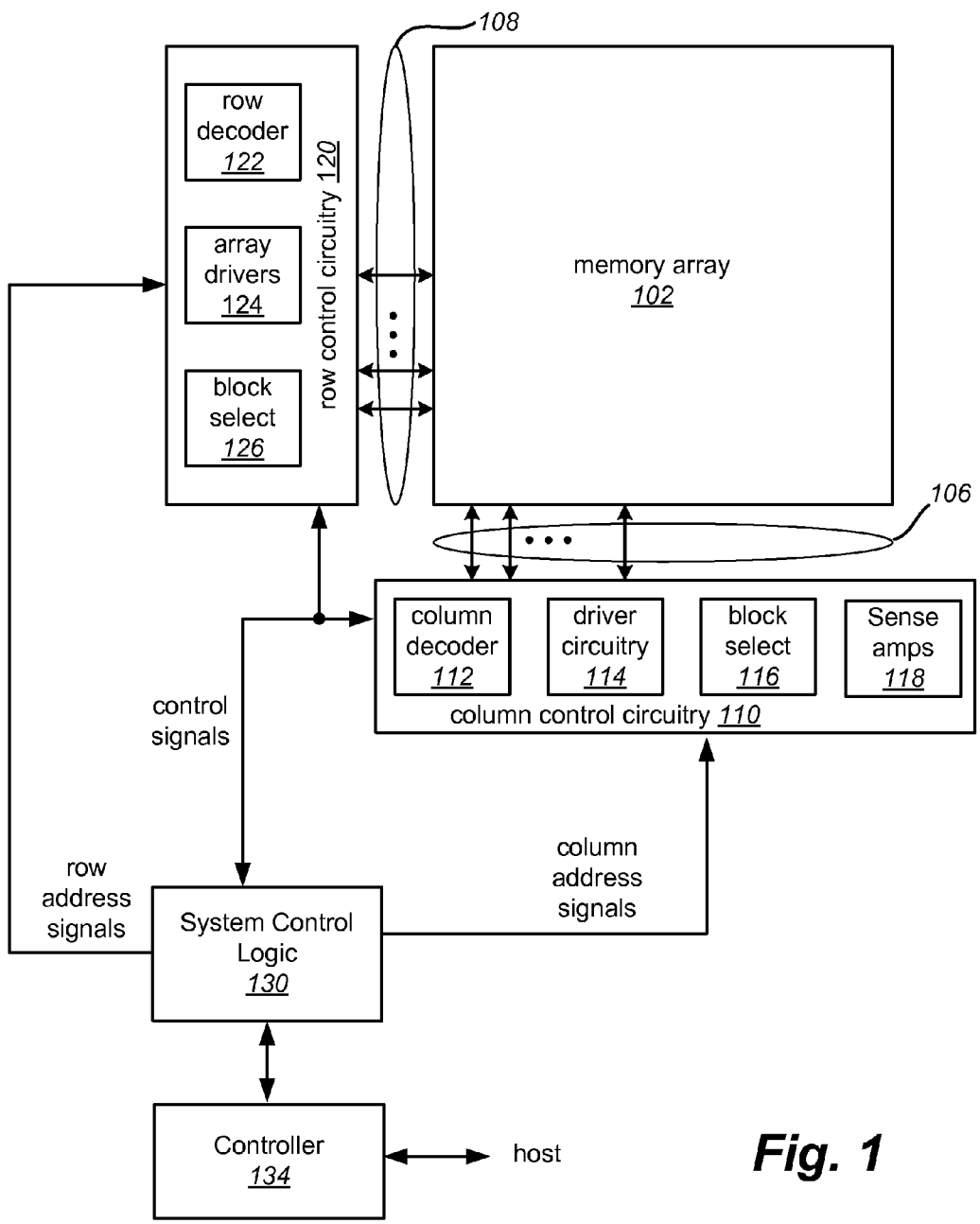
FIG. 1 is a block diagram of one embodiment of a memory system.

FIG. 1 is a block diagram that depicts one example of a memory system 100 that can implement the technology described herein. Memory system 100 includes a memory array 102, which can be a two or three dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of M row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of N column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used herein.

System control logic 130 receives data and commands from controller 134 and provides output data to controller 134. Controller 134 communicates with a host. System control logic 130 may include one or more state machines, registers and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. More information about suitable embodiments like that of FIG. 1 can be found in the following United States patents that are incorporated herein by reference in their entirety: U.S. Pat. No. 6,879,505; U.S. Pat. No. 7,286,439; U.S. Pat. No. 6,856,572; and U.S. Pat. No. 7,359,279. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be thought of as one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer. Examples of memory cells can be found in U.S. Pat. No. 6,034,882; U.S. Pat. No. 6,525,953; U.S. Pat. No. 6,952,043; U.S. Pat. No. 6,420,215; U.S. Pat. No. 6,951,780; and U.S. Pat. No. 7,081,377.

In another embodiment, memory cells are re-writable. For example, U.S. Patent Application Publication No. 2006/0250836, which is incorporated herein by reference in its entirety, describes a rewriteable non-volatile memory cell that includes a diode coupled in series with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
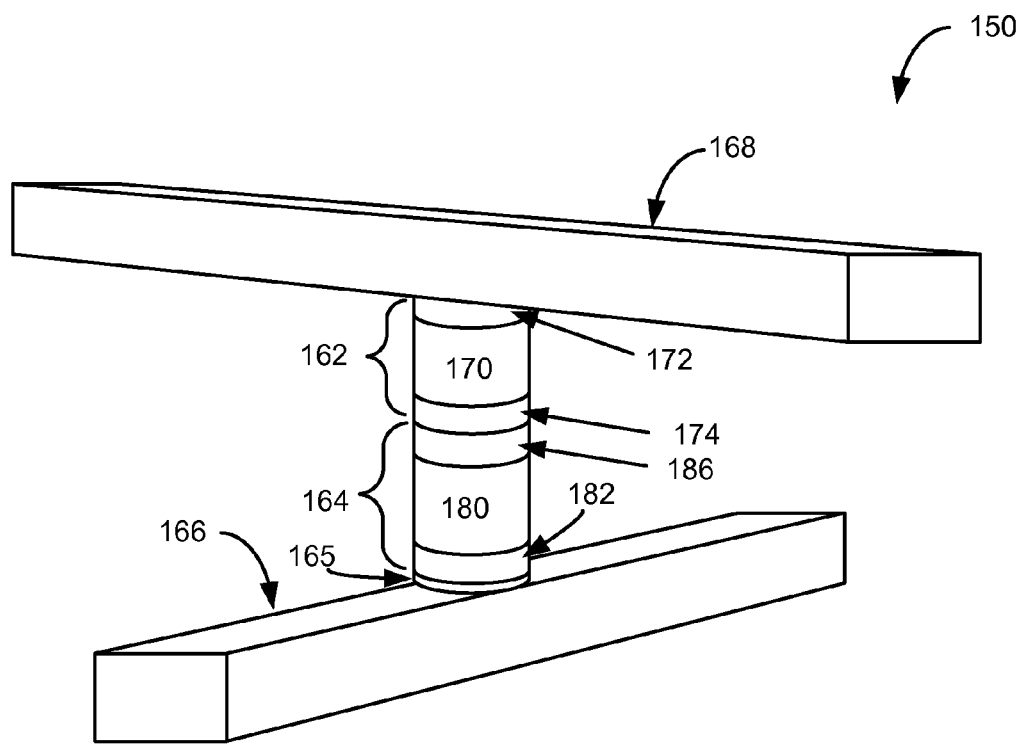
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168.

Reversible resistance-switching element 162 includes reversible resistance-switching material 170 having a resistance that may be reversibly switched between two or more states. In some embodiments, reversible resistance-switching material 170 may be formed from a metal oxide. Various different metal oxides can be used. In one example, nickel oxide is be used.

In at least one embodiment, through use of a selective deposition process, a nickel oxide layer may be used in a reversible resistance-switching material without the nickel oxide layer being etched. For example, a reversible resistance-switching element may be formed by employing a deposition process such as electroplating, electroless deposition, or the like, to selectively deposit a nickel-containing layer only on conductive surfaces formed above a substrate. In this manner, only the conductive surfaces on the substrate are patterned and/or etched (prior to deposition of the nickel-containing layer) and not the nickel-containing layer.

In at least one embodiment, the reversible resistance-switching material 170 includes at least a portion of a nickel oxide layer formed by selectively depositing nickel and then oxidizing the nickel layer. For example, Ni, $Ni_xP_y$, or another similar form of nickel may be selectively deposited using electroless deposition, electroplating or a similar selective process, and then oxidized to form nickel oxide (e.g., using rapid thermal oxidation or another oxidation process). In other embodiments, nickel oxide itself may be selectively deposited. For example, an NiO—, $NiO_x$— or $NiO_xP_y$—containing layer may be selectively deposited above the steering element using a selective deposition process and then annealed and/or oxidized (if necessary).

Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described more fully in Rose et al., U.S. Pat. No. 5,541,869. Another class of material is taught by Ignatiev et al. in U.S. Pat. No. 6,473,332: these are perovskite materials such as $Pr_{1-X}Ca_XMnO_3$ (PCMO), $La_{1-X}Ca_XMnO_3$ (LCMO), $LaSrMnO_3$ (LSMO), or $GdBaCo_XO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group WA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. This chalcogenide glass (amorphous chalcogenide, not in as crystalline state) is formed in a memory cell adjacent to a reservoir of mobile metal ions. Some other solid electrolyte material could substitute for chalcogenide glass. Other variable resistance material includes amorphous carbon, graphite and carbon nanotubes. Other materials can also be used with the technology described herein.

More information about fabricating a memory cell using reversible resistance-switching material can be found in United States Patent Application Publication 2009/0001343, "Memory Cell That Employs A Selectively Deposited Reversible Resistance Switching Element and Methods of Forming The Same," incorporated herein by reference in its entirety. Additional information can also be found in United States Patent Application Publication No. 2009/0323391, "Reverse Set With Current Limit for Non-Volatile Storage," filed on Dec. 19, 2008, incorporated herein by reference in its entirety.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array. Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180, as described, for example, in U.S. Patent Application Publication No. 2006/0087005, filed Dec. 9, 2005 and titled "DEPOSITED SEMICONDUCTOR STRUCTURE TO MINIMIZE N-TYPE DOPANT DIFFUSION AND METHOD OF MAKING," which is hereby incorporated by reference herein in its entirety. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistance silicon thereby is provided. Similar results may be achieved for silicon-germanium alloy and/or germanium diodes.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication.

Although the reversible resistance-switching element 162 is shown as being positioned above the steering element 164 in FIG. 2, it will be understood that in alternative embodiments, the reversible resistance-switching element 162 may be positioned below the steering element 164.

While FIG. 2 shows one example of a memory cell, no one particular type or structure of a memory cell is required for the technology disclosed herein. Many different types of memory cells can be used.

Figure 3:
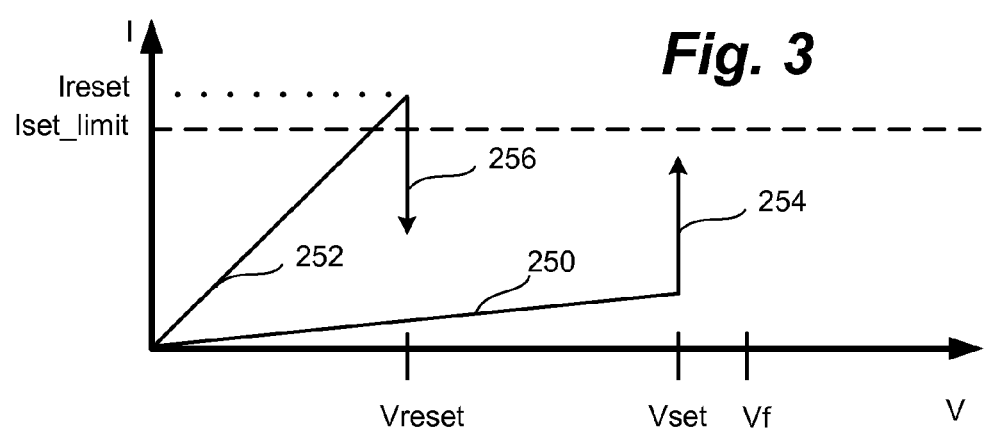
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein. Examples of SET and RESET can be found in United States Patent Application 2009/0323391, "Reverse Set With Current Limit for Non-Volatile Storage," filed on Dec. 19, 2008, incorporated herein by reference in its entirety; United States Patent Application 2007/0072360, incorporated herein by reference in its entirety; and United States Patent Application 2007/0008785, incorporated herein by reference in its entirety.

In some embodiments, circuits that provide, control and/or limit the current through a memory cell can be far away from the memory cell. This distance can be more of an issue for a monolithic three dimensional memory array where the control circuitry is on the substrate surface and the memory cells are on upper layers of the three dimensional memory array (as described above). Because of this distance, the conductive paths can get quite long which results in relatively large capacitances for the lines. In some cases, after a memory cell is SET, the capacitive charge on the lines will subsequently dissipate through the memory cell, which can cause extra current to pass through the reversible resistance-switching element. This extra current may cause the reversible resistance-switching element to SET to such a low resistance value that it is difficult or impossible to RESET the element. One proposed solution is to discharge the bit line and data bus during the SET operation so that after the SET have been achieved, no unwanted current will subsequently be driven through the memory cell. In this embodiment, the diode will be forward biased during the SET operation and Vset will be applied to the memory cell as a pulse (or other form). The Vset pulse will be shorter than the time needed to SET the reversible resistance-switching element so that the charge from the bit line and data bus will be needed to provide the extra charge not provided by the Vset pulse. For example, a voltage pulse will be used to charge the bit line connected to a memory cell. Due to its parasitic capacitance, the bit line will hold a charge. After being charged up, the bit line will be cut off from the voltage source so that the bit line is floating. The charge on the bit line will then dissipate through the memory cell to the word lines, causing the memory cell to SET. One example of the capacitive discharge method can be found in United States Patent Application 2009/0323393, "Capacitive Discharge Method For Writing To Non-Volatile Memory," filed on Dec. 19, 2008, incorporated herein by reference in its entirety.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
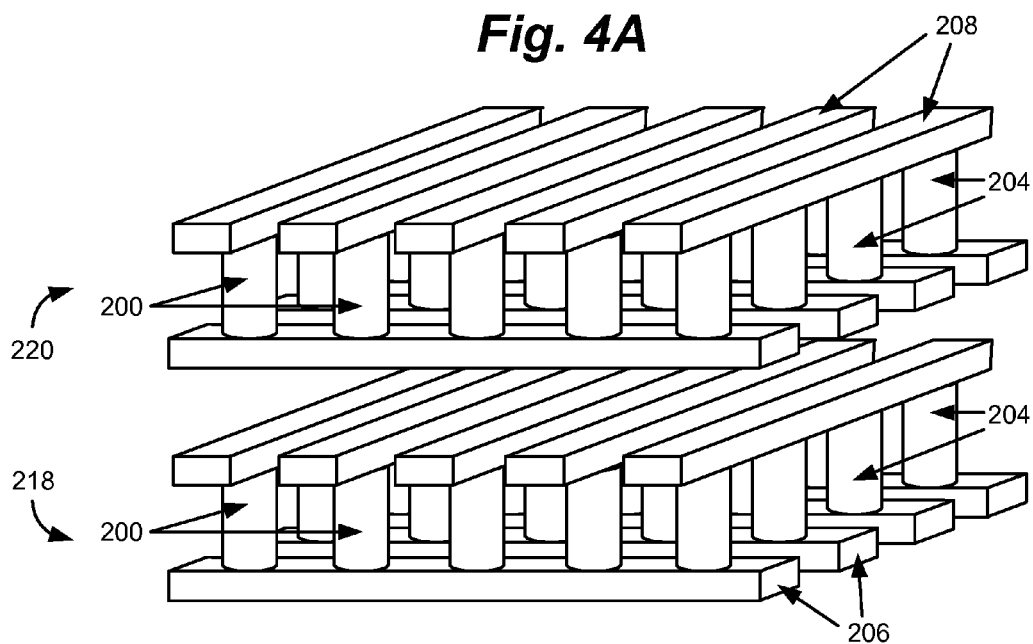
FIG. 4A is a simplified perspective view of a portion of one embodiment of a three-dimensional memory array.

Memory array 102 will comprise many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
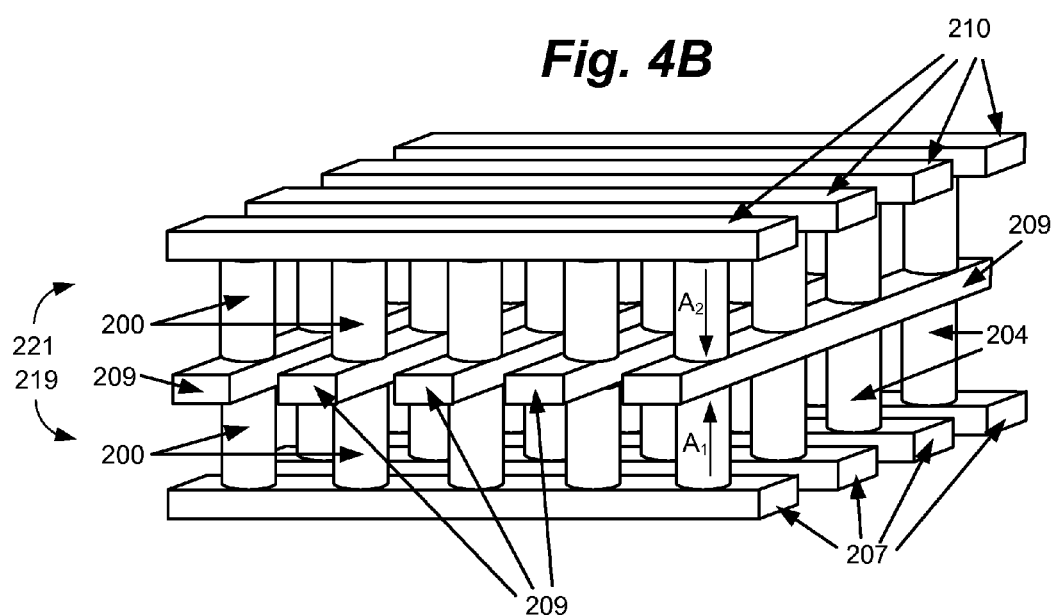
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B. Additional information is described in U.S. Pat. No. 6,952,030, "High-Density Three-Dimensional Memory Cell," which is hereby incorporated by reference herein in its entirety.

In the embodiment of FIG. 4B, the diodes (or other steering devices) on adjacent memory levels preferably point in opposite directions, as described in U.S. Patent Application Publication No. 20070190722, filed Mar. 27, 2007 and titled "Method to Form Upward Pointing P-I-N Diodes Having Large And Uniform Current," which is hereby incorporated by reference herein in its entirety. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
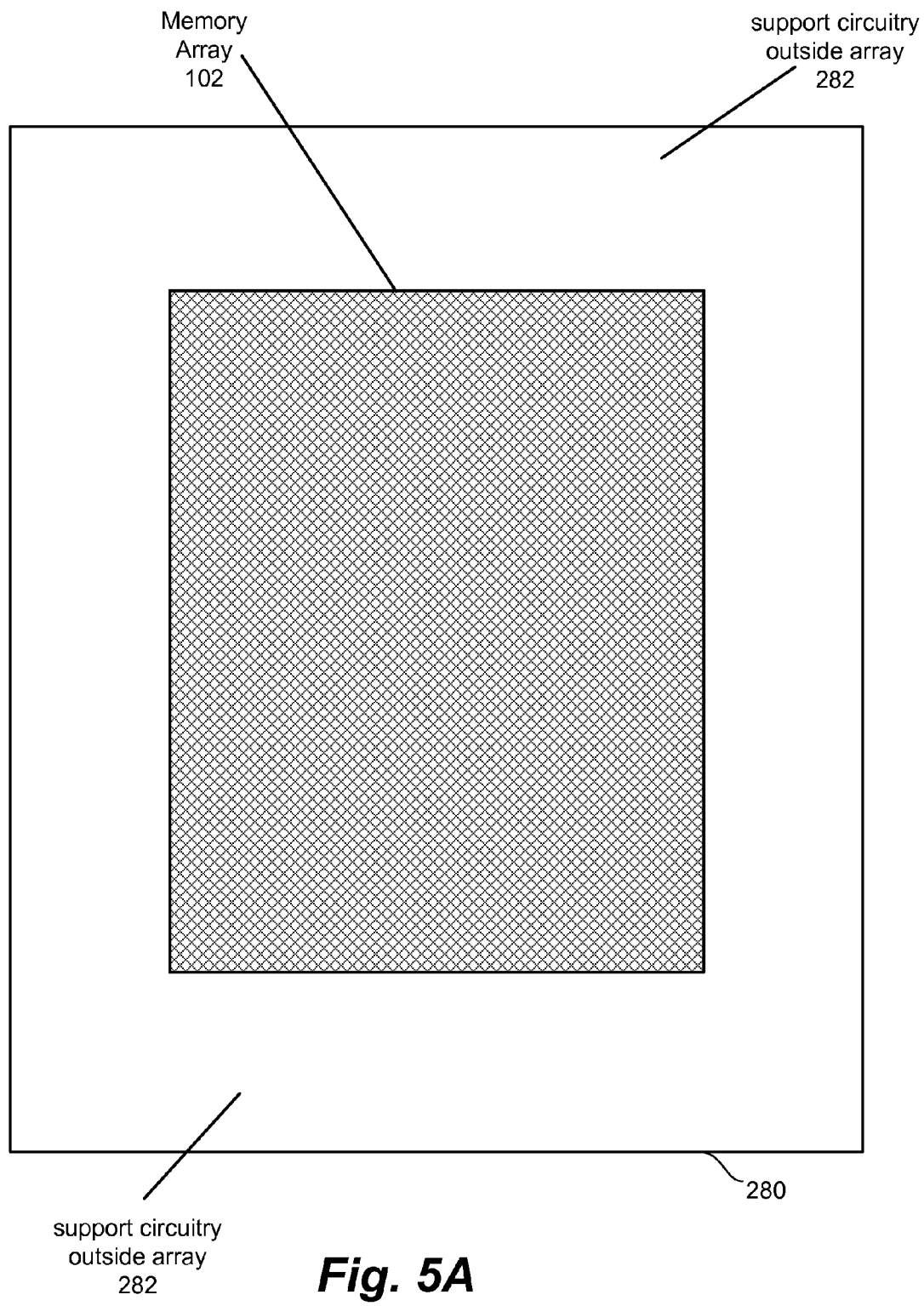
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there would be additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

Figure 5B:
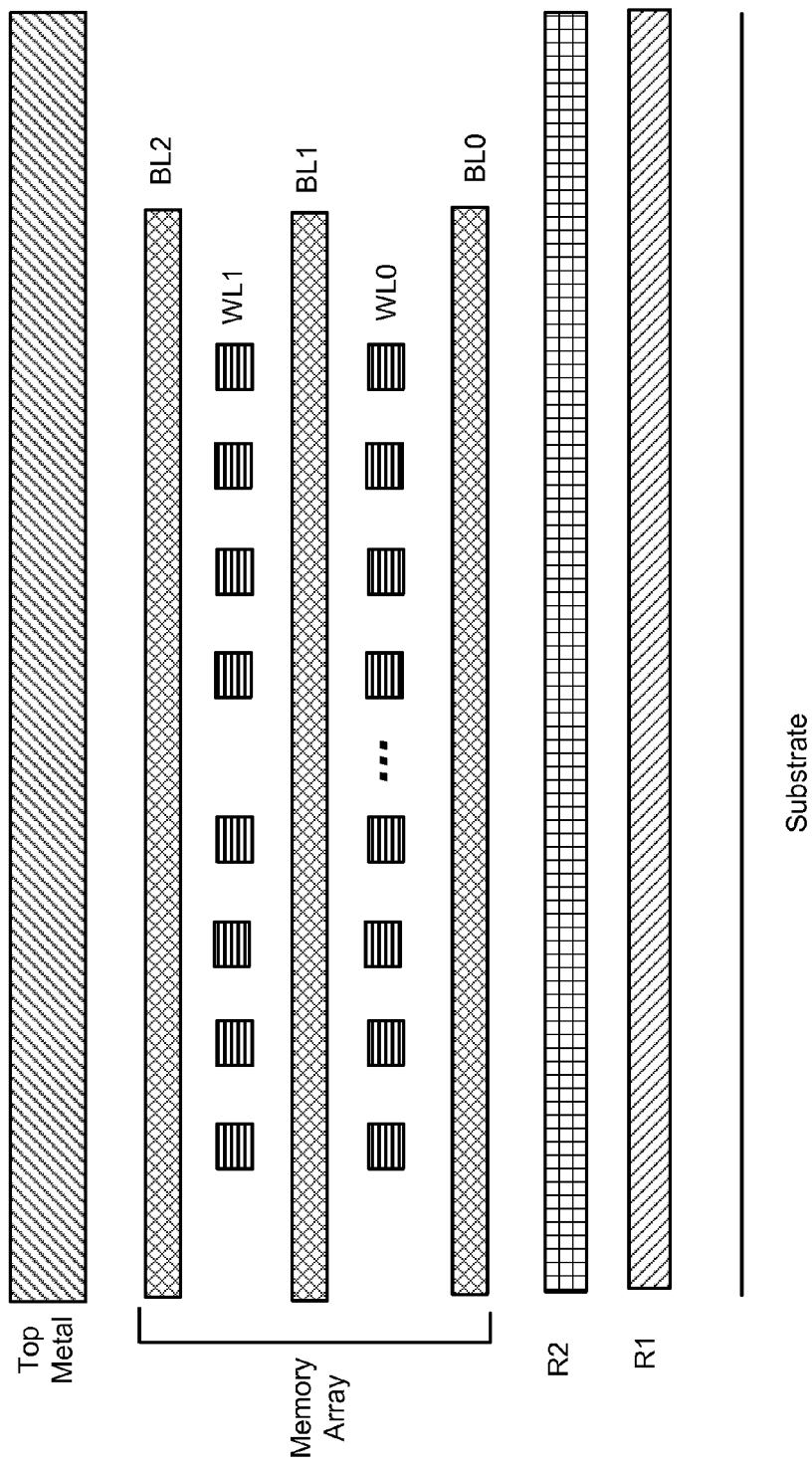
FIG. 5B depicts a subset of the layers of one embodiment of a three-dimensional memory.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/squre), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/squre), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
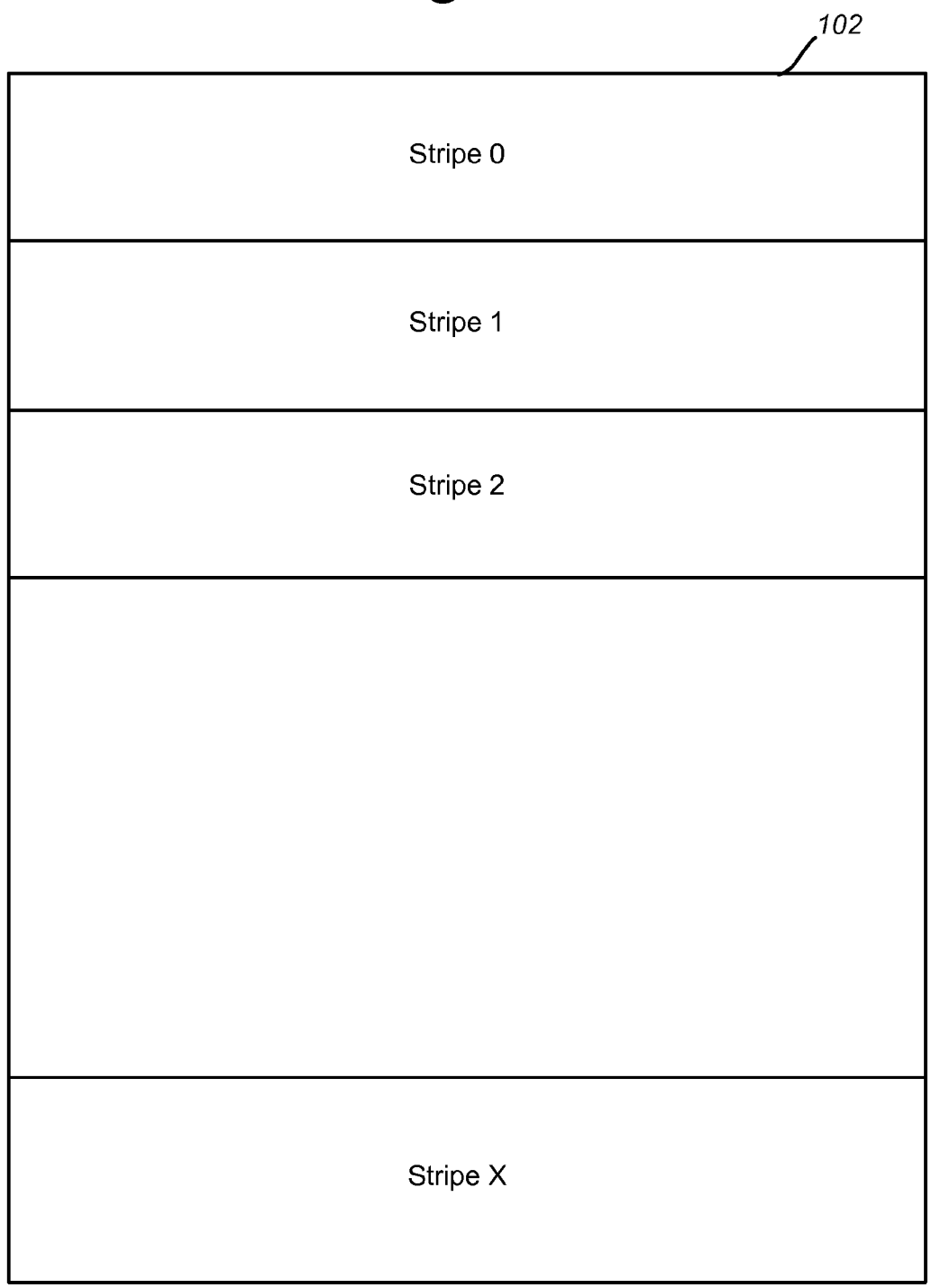
FIG. 6 depicts one example organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one strip or a portion of one stripe. In some implementations, a bay can be implemented across all or portions of two or more stripes. Each bay includes multiple blocks. The number of blocks in a bay can vary.

Figure 7:
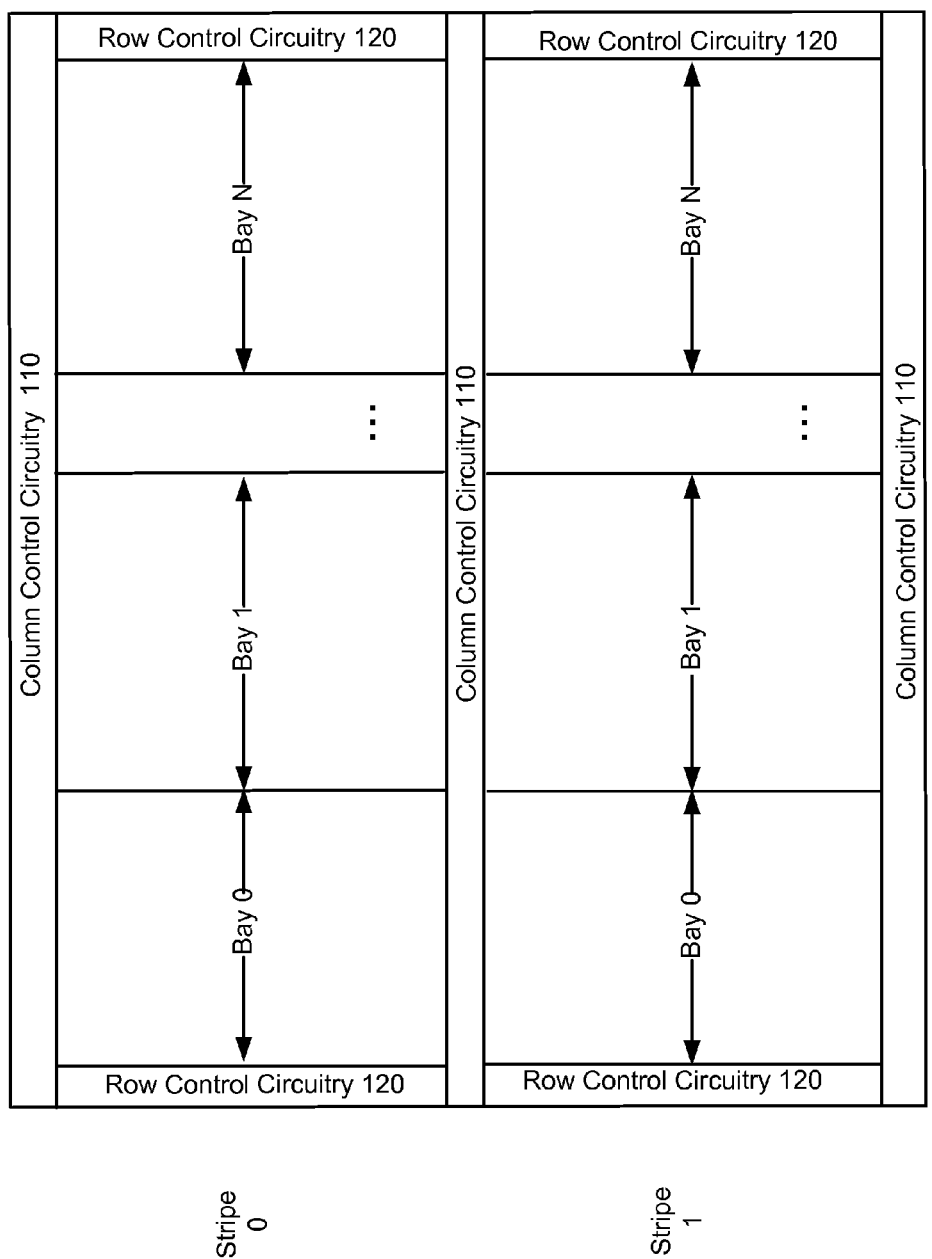
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
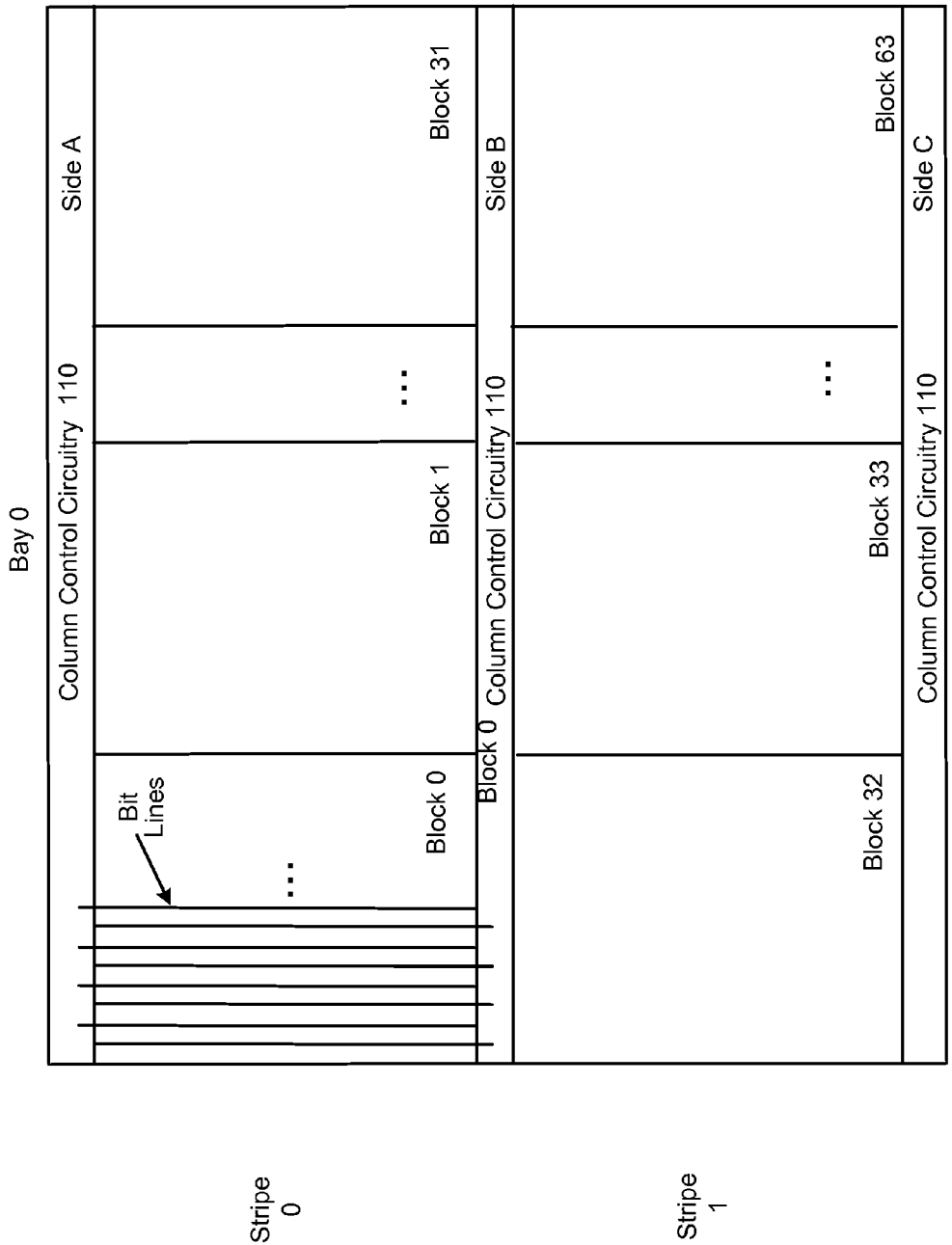
FIG. 8 depicts one embodiment of a bay.

FIG. 8 provides more details of one example bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.).

In one embodiment, there are two sense amplifiers located below each block, for example, on the surface of the substrate. One of the two sense amplifiers are for bit lines that connect to Column Control Circuitry 110 on side A and the other sense amplifier is for bit lines that connect to Column Control Circuitry 110 on side B. In the embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

In previous systems, global routing lines for routing signals between the 64 (or less) selected memory cells and the sense amplifiers were implemented in metals layers R1 or R2, which have a relatively large resistance and capacitance. To reduce overall resistance and capacitance, some previous designs have implemented half of the global routing lines for routing signals between the selected memory cells and the sense amplifiers in R1 (or R2) and the other half of the global routing lines for routing signals between the selected memory cells and the sense amplifiers implemented in Top Metal. While this scheme does reduce resistance and capacitance, the reduction is not enough to allow for high speed operation. In previous implementations, each one of the global routing lines were touching all decoding transistor drains, which increase the total capacitance associated to the line.

Figure 9:
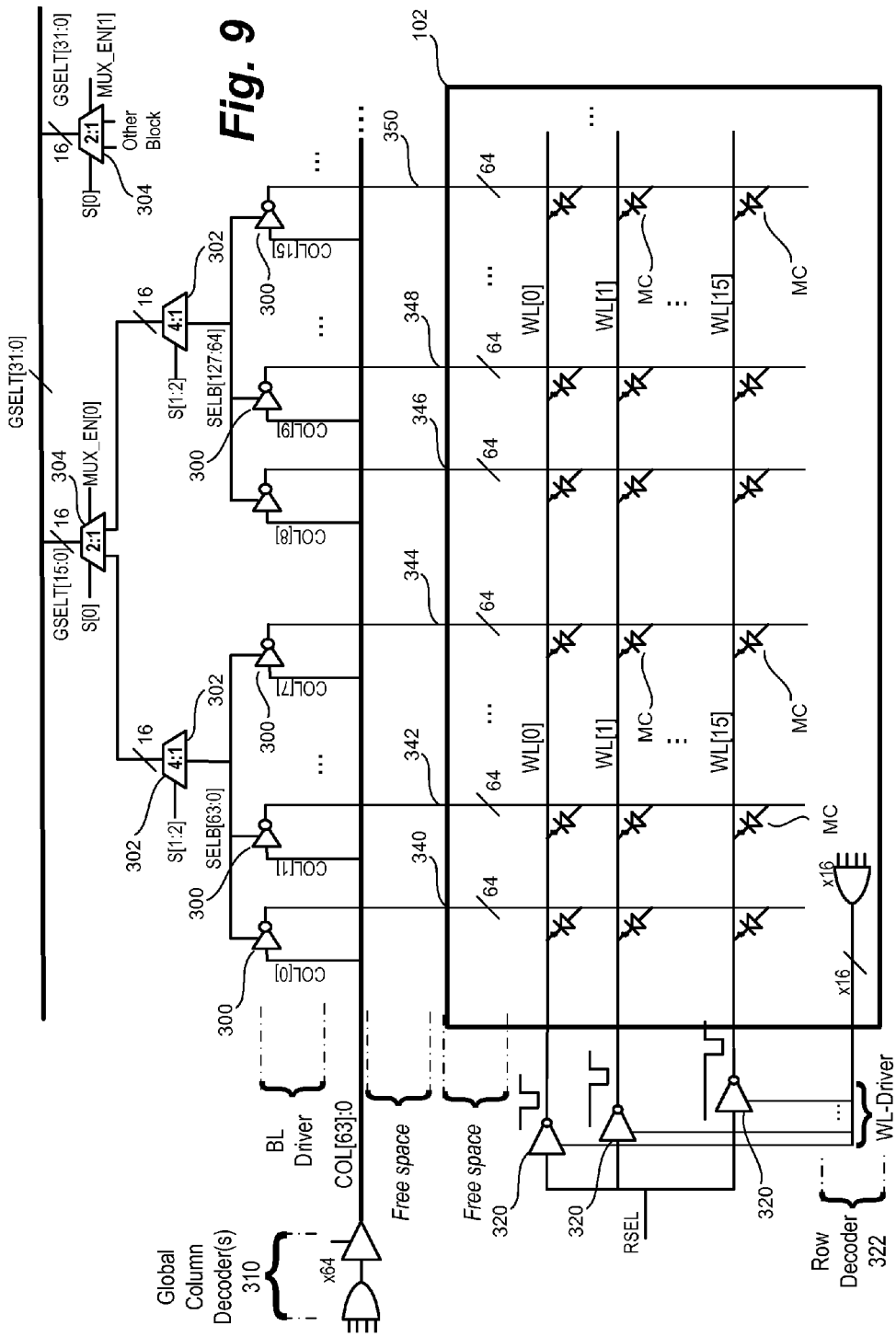
FIG. 9 is a schematic diagram of one embodiment of the data lines and selection circuits for a block of memory cells.

FIG. 9 is a schematic diagram that depicts a portion of the routing signals and selection circuits for one embodiment of Column Control Circuitry 110. A portion of one block is depicted. In one embodiment, each block includes 64 columns of bit lines and 64 columns of selection circuits 300 for electrically connecting bit lines of the column to sense amplifiers on one side of the array (e.g. side A FIG. 8), and 64 columns of bit lines and 64 columns of selection circuits for connecting to bit lines to sense amplifiers on the other side of the array (e.g. side B of FIG. 8). FIG. 9 only shows the 64 columns of selection circuits 300 for one side. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has two sets of local data lines for each of the two sides. For example, FIG. 9 shows the local data lines for one side as SELB[63:0] and SELB[127:64]. In one embodiment, the local data lines are implemented in metal layer R1 under their respective block, and only run the width of the respective block. Selection circuits 300 for a particular column are used to selectively connect the sixty four bit lines for that column to sixty four respective local data lines (e.g., SELB0[63:0] or SELB[127:64]. Each of the selection circuits 300 receives a selection signal from column decoders 112 and a bit line connection from one of the sixty four bit lines associated with the column. Based on the selection signal from column decoder 112, the selection circuit 300 will connect or disconnect the bit line to a respective one of the local data lines.

As mentioned above, in the embodiment of FIG. 9 each block will have two sets of local data lines (e.g. SELB[63:0] and SELB[127:64]). Half of the columns of bit lines will be connectable to the first set of local data lines and the other half of the columns of bit lines will be connectable to the second set of local data lines. In this manner, two columns can be concurrently connected to local data lines. For example, a first column of bit lines can be connected to SELB[63:0] and a second column of bit lines can be concurrently connected to the second set of local data lines SELB[127:64].

In one example implementation, a page of data is written across 16 columns and the columns are arranged such that half (e.g., 8) the columns for a particular page are connectable to the first set of local data lines SELB[63:0] and the half of the columns of bit lines for a page are connectable to SELB[127:64]. In other embodiments, a page can be across more or less than 16 columns of bit lines. In other implementations, a block can include more than two sets of local data lines.

Each selection circuit 300 selectively connects a bit line to the appropriate local data line. The local data lines are connected to 4:1 multiplexors 302 such that SELB[63:0] are connected to a first set of 4:1 multiplexors 302 and SELB [127:64] are connected to a second set of 4:1 multiplexors 302. Thus, selection circuits 300 can be thought of as selectively connecting columns of bit lines to multiplexors 302 (which can be also thought of selection circuits). Both sets of 4:1 multiplexers will include sixteen multiplexors 302; therefore, the set of multiplexors 302 for a given set of local data lines will choose sixteen of the sixty four bit lines to output based on two selection signals S[1:2].

The output of the sixteen 4:1 multiplexors 302 connected to SELB[63:0] are provided to sixteen 2:1 multiplexors 304. The output of the sixteen 4:1 multiplexors 302 connected to SELB[127:64] are also connected to the sixteen 2:1 multiplexors 304. Each multiplexor 304 will receive 1 bit from SELB[63:0] and 1 bit from SELB[127:64]. Based on the selection signal S[0], the respective multiplexor 304 will choose to output one bit from either SELB[63:0] or one bit from SELB[127:64]. Alternatively, the signal MUX_EN[0] can be used to float the output of a 2:1 multiplexor 304. This way each block has a set of 2:1 multiplexors 304 connectable to the same global data lines, and the multiplexor enables signal MUX_EN[x] for multiplexors 304 will be used to selectively connect selected bit lines to the global data lines.

In one embodiment, the global data lines, implemented in Top Metal, run across the entire bay. In one embodiment, a bay will include two sets of global data lines, with one set of global data lines on top of the bay and another set of global data lines on the bottom of the bay: GSELT[31:0] and GSELB [31:0]. FIG. 9 only shows the global data lines at the top of the block, GSELT[31:0]. Each of the global data lines are connected to one sense amplifier. As there are sixty four global data lines for a bay, there are sixty four sense amplifiers for that same bay. Each of the sense amplifiers are positioned underneath the bay of memory cells. In one embodiment, there is one sense amplifier underneath each block of a bay.

FIG. 9 also shows a 2:1 multiplexors 304 for a different block ("Other Block"). Note that these sixteen 2:1 multiplexors 304 for the Other Block are also connected to GSELT[31: 0]. However, multiplexors 304 for the Other Block receive a different multiplexor enable signal MUX_EN[1]; therefore, bit lines for the Other Block can be selectively connected to the appropriate sense amplifier in a manner such that bit lines from only one Block at a time will be connected to any given bit of the global data lines.

FIG. 9 also shows global column decoders 310 (which are a part if column decoder circuits 112). Each of the selection circuits 300 is controlled by one or more of global column decoders 310. In one embodiment, there are sixty four sets of global column decoders 310 for each stripe and the global column decoders 310 are positioned on the substrate surface outside of memory array 102 (e.g., not beneath memory array 102). One single global column decoder 310 is shared by all blocks of a particular stripe. Therefore, when a global column decoder selects column 0, then column 0 is selected for every block in the stripe.

Multiplexor circuits 302 and 304 are used to selectively connect the respected local data lines to the global data lines so that only local data lines for a subset of one or more blocks are connected to the global data lines. Because all of the blocks in the stripe share the same column decoder, space is freed up on the substrate surface, as compared to prior designs (see "Free space"). One reason that the column decoders 310 can be global for the entire stripe is that it is not necessary to have a column decoder local to each block. Prior designs would have a decoder local to each block to increase the speed for switching columns. However, the present technology will switch columns during a programming process for another column; therefore, there is no overhead for column switching. In one embodiment, there is a global column decoder circuit 310 for each of the sixty columns per block. The global column decoders 310 are in communication with system control logic 130 (see FIG. 1).

FIG. 9 also depicts a portion of one block of memory array 102. The block depicted in FIG. 9 includes a set of word lines WL[0], WL[1], . . . WL[15] connected to word line drivers 320 (e.g., same structure as selection circuits 300), which are controlled by one or more row decoders 322. In one embodiment, row decoders 322 are positioned on the substrate surface underneath memory array 102. Row decoders 322 (a part if row decoder circuits 122) are in communication with system control logic 130. As memory array 102 implements a cross point array, memory array 102 will include a set of memory cells MC that connect between word lines and bit lines such that each memory cell is connected at one end to a word line and at another end to a bit line. Not all of the memory cells depicted in FIG. 9 are labeled MC.

In one embodiment, when programming the circuit of FIG. 9, row decoder 322 will cause word line drivers 320 to select one word line. Two of the global column decoders 310 will concurrently select two columns of bit lines, with one column of bit lines being connected to SELB[63:0] and another column of bit lines being connected to SELB[127:64]. The 4:1 multiplexors 302 then select a portion of the connected column to be connected to the 2:1 multiplexor. Thus, sixteen bit lines from each column from the first group of columns of bit lines and sixteen bit lines from each column from the first group of columns of bit lines will be provided to 2:1 multiplexors 304. Multiplexors 304 will then select bit lines (via the respective local data lines SLB[x]) from one of the connected two columns for the block to be connected to sixteen bits of the global data lines. The other sixteen bits of the global data lines will be connected to bit lines for another block (e.g. the "Other Block"). Therefore, multiplexors 304 for two blocks will allow connections to the global data lines while the other blocks will float their outputs of the multiplexors. The sixteen bit lines for a particular block connected to the global data lines receive the appropriate program voltage via the sense amplifiers (or other signal sources) connected to the respective global data lines in order to program the memory cells connected to the selected bit lines. Thus, the structure depicted in FIG. 9 thus includes two levels of multiplexors with the 4:1 multiplexors 302 being a first level of multiplexors and the 2:1 multiplexors 304 being a second level of multiplexors.

Figure 10:
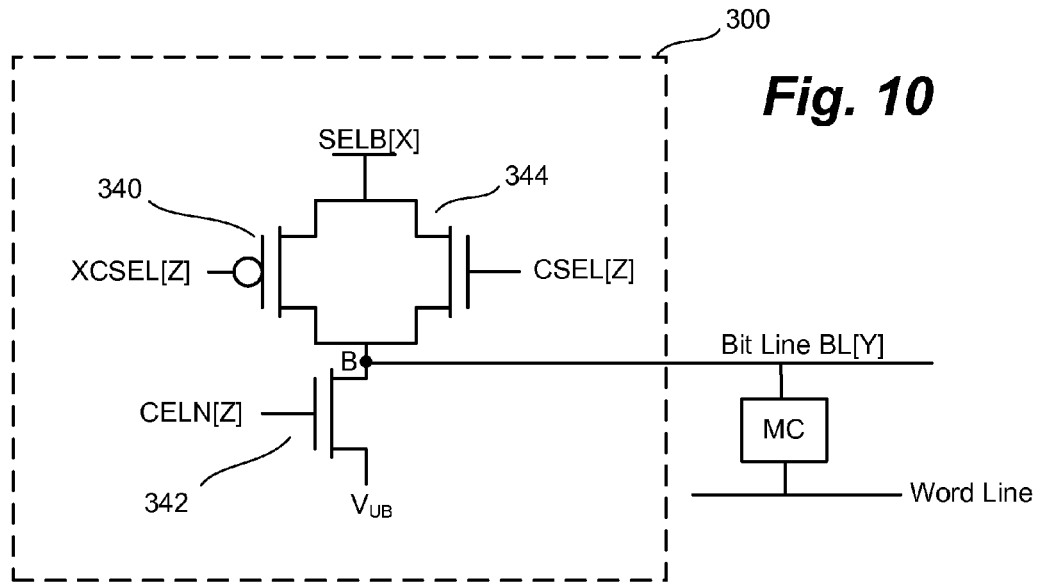
FIG. 10 is a schematic diagram of one embodiment of a selection circuit.

FIG. 10 is a schematic diagram showing the details of one embodiment of selection circuits 300. The selection circuit 300 is connected to one of the local data lines SELB[X] and one of the bit lines. The bit line is connected to one terminal of the memory cell MC. A word line is connected to the other terminal of the memory cell MC. Selection circuit 300 includes transistor 340 and transistor 344 both connected to SELB[X]. Transistor 340 and transistor 344 are also both connected to transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The base of transistor 344 is connected to selection signal CSEL[Z]. Note that XCSEL[Z] is an inverted version of CSEL[Z]. The base of transistor 342 is connected to CELN[Z]. The signals CSEL[Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z].

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL[Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB. When transistors 340 and 344 are off and CELN[Z] is 0, then transistor 342 is off and the bit line BL[Y] is floating. This condition is useful for the some embodiments of the capacitance discharge method of programming described herein.

Figure 11:
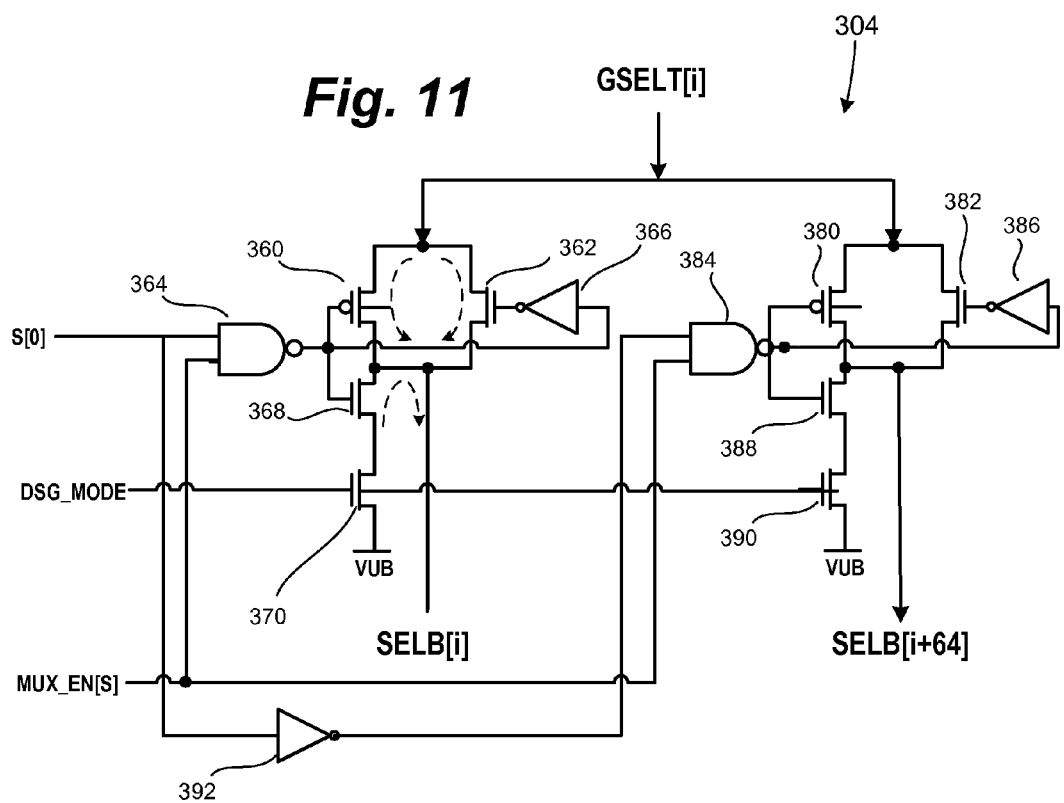
FIG. 11 is a schematic diagram of one embodiment of a multiplexer circuit.

FIG. 11 is a schematic of a circuit for the 2:1 multiplexer (MUX 304) depicted in FIG. 9. The respective global data line GSELT[i] (which could be GSELT[i] for the top side or GSELBT[i] for the bottom side) is connected to transistors 360, 362, 380 and 382. Transistors 360 and 362 are also connected to the first of the two local data lines SELB[i]. Thus, transistors 360 and 362 provide a path between the global data line GSELT[i] and the local data line SELB[i] when the transistors are on. In addition to being connected to GSELT[i], transistors 380 and 382 are also connected to the second local data line SELB[i+64]. Thus, transistors 380 and 382 provide a path between global data line GSELT[i] and the second local data line SELB[i+64] when the transistors are on.

The inverted gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 0 when performing one of the possible embodiments of the programming operation using the capacitance discharge mode of programming described herein. By setting signal DSG_MODE to 0, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 370 receives the signal DSG_MODE from system control logic 130.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all global data lines will be used for simultaneous programming or the respective block is not selected for programming.

Figure 12:
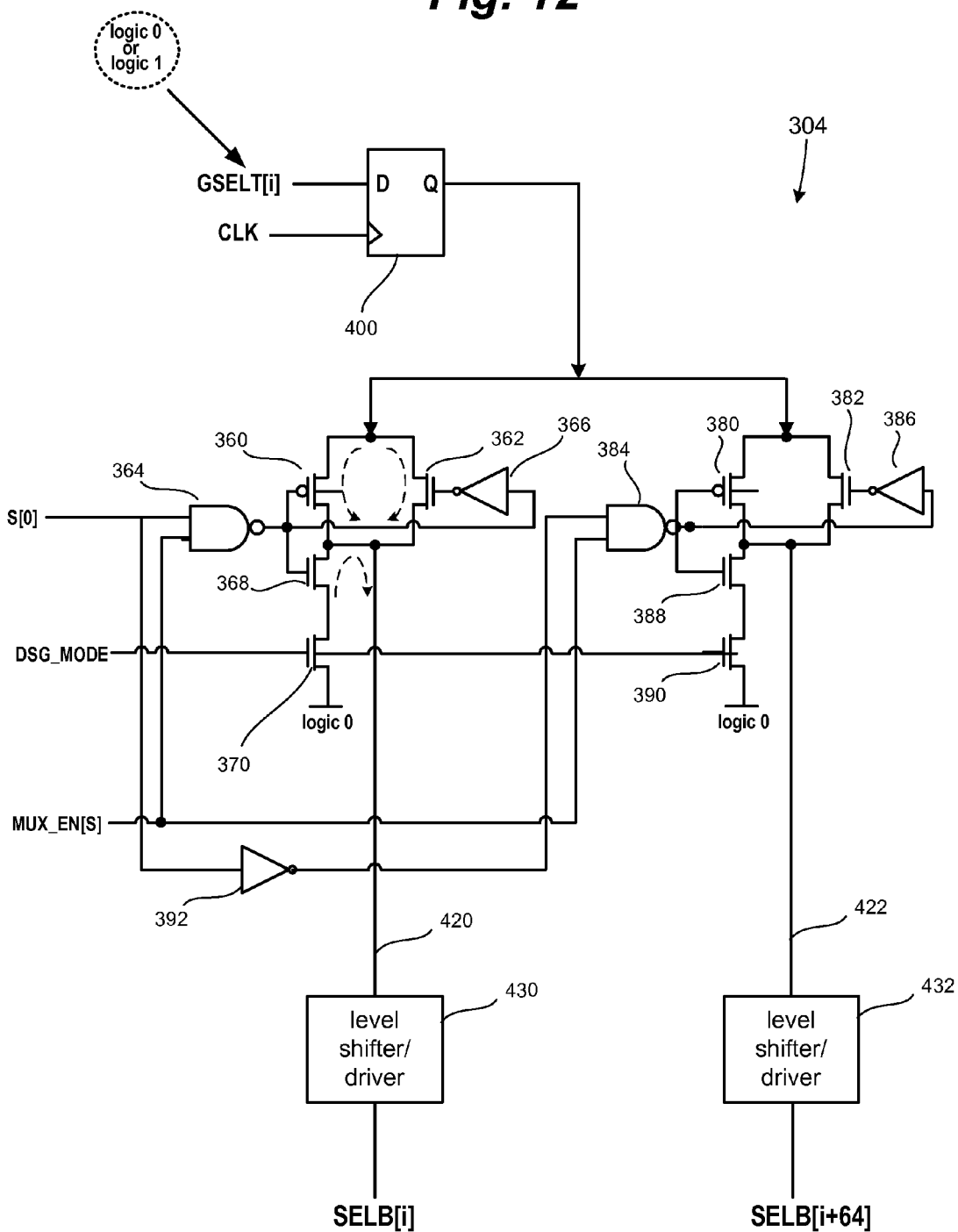
FIG. 12 is a schematic diagram of one embodiment of a multiplexer circuit.

FIG. 12 is a schematic of another embodiment of circuit for the 2:1 multiplexer (MUX 304) depicted in FIG. 9. In some embodiments the memory system does not program all sixty four memory cells connected to the sixty four global data lines due to power issues. For example, it may not be desirable for the system to use the magnitude of power necessary to simultaneously program sixty four memory cells. In those cases, programming is divided into multiple sense amplifier cycles. Each sense amplifier cycle will include programming a subset (e.g., 16) of the sixty four memory cells connected to the sixty four global data lines. In one embodiment, this means reloading the data on the global data lines (GSELB) for every sense amplifier cycle. FIG. 12 provides an embodiment of a multiplexer where the data need only be loaded once and will then be available for all (or at least a subset of multiple) sense amplifier cycles.

The muilplexer circuit of FIG. 12 includes a storage device, a select circuit and a level shifter/driver. In one embodiment, the storage device includes flip flop 400, which is used to store the data for the current word line cycle. The D input to flip flop 400 receives one bit of GSELT[i] each pulse received at the CLK input. In other embodiments, a latch or other storage device can be used instead of the D flip flop. In other embodiments, more than one level of flip flops or latches can be used. The output of D flip flop 400 is provided to the select circuit which includes the multiplexor circuit described above with respect to components 360-390 of FIG. 11. All the same reference numbers from FIG. 12 that correspond to FIG. 11 are used to identify the same components that perform the same function. A difference between the multiplexor of FIG. 12 and the multiplexor of FIG. 11 is that the output of the multiplexor of FIG. 11 is provided directly to the local data lines. However, the multiplexor (select circuit) of FIG. 12 provides the outputs 420 and 422 to level shifter 430 and level shifter 432, respectively. Level shifter 430 is connected to SELB[i]. Level shifter/driver 432 is connected to SELB[i+64].

Level shifters are standard level shifters known in the art. Each level shifter will receive a low voltage logic signal and create/output (and drive) a level shifted signal that is higher in voltage than the inputted low voltage logic signal. For example, a sense amplifier need not drive the program voltage on the global data line. Instead, a sense amplifier will only drive a logic 0 or a logic 1. In one example embodiment, logic 1 can be 3 volts and logic 0 can be 0 volts. When the circuit of FIG. 12 is operated, the level shifters 430 and 432 will receive either the logic 1 (e.g. 3 volts), or logic 0 (ground) from the D flip flop via the multiplexer circuit. Level shifters 430 or 432 will then convert 3 volts to the program voltage and convert 0 volts to the unselected bit line voltage. One example of a suitable program voltage is 8 v. One example of a suitable unselected bit line voltage is 1 v.

Figure 13:
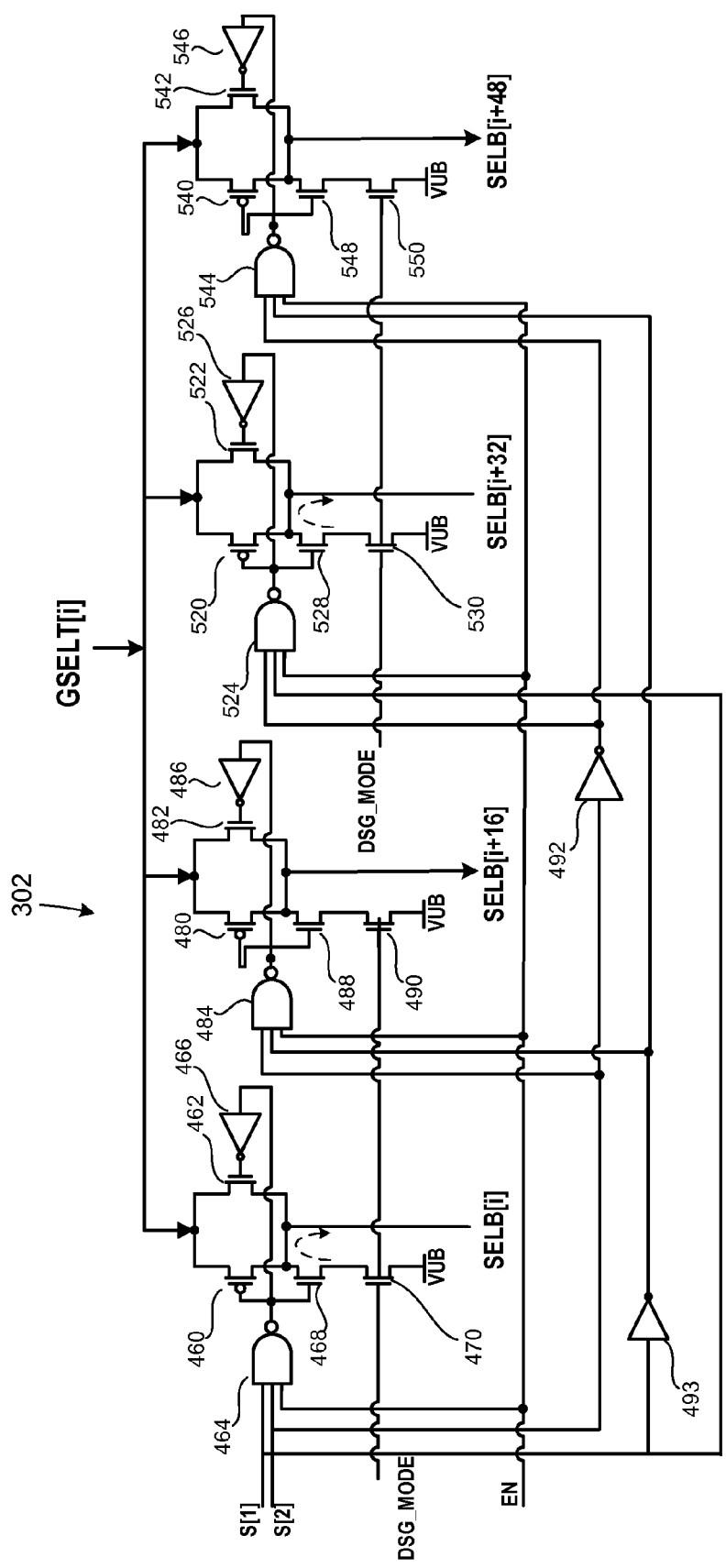
FIG. 13 is a schematic diagram of one embodiment of a multiplexer circuit.

FIG. 13 is a schematic of a circuit for the 4:1 multiplexer (MUX 302) depicted in FIG. 9. The respective global data line GSELT[i] (which could be GSELT[i] for the top side or GSELBT[i] for the bottom side) is connected to transistors 460, 462, 480, 482, 520, 522, 540 and 542. Transistors 460 and 462 are also connected to the first of the four local data lines SELB[i]. Thus, transistors 460 and 462 provide a path between the global data line GSELT[i] and the local data line SELB[i] when the transistors are on. In addition to being connected to GSELT[i], transistors 480 and 482 are also connected to the second local data line SELB[i+16]. Thus, transistors 480 and 482 provide a path between global data line GSELT[i] and the second local data line SELB[i+16] when the transistors are on. In addition to being connected to GSELT[i], transistors 510 and 522 are also connected to the second local data line SELB[i+32]. Thus, transistors 510 and 522 provide a path between global data line GSELT[i] and the second local data line SELB[i+32] when the transistors are on. In addition to being connected to GSELT[i], transistors 540 and 546 are also connected to the second local data line SELB[i+48]. Thus, transistors 540 and 546 provide a path between global data line GSELT[i] and the second local data line SELB[i+48] when the transistors are on.

The inverted gate of transistor 460 is connected to the output of NAND gate 364. The gate of transistor 462 is connected to the output of inverter 466. The input of inverter 466 is connected to the output of NAND gate 464. The output of NAND gate 464 is also connected to the gate of transistor 468. Transistor 468 is connected between SELB[i] and transistor 470. Transistor 470 is connected between transistor 468 and the unselected bit line voltage VUB. The gate of transistor 470 receives the signal DSG_MODE from system control logic 130. The signal DSG_MODE is set to 0 when performing one of the possible embodiments of the programming operation using the capacitance discharge mode of programming described herein. By setting signal DSG_MODE to 0, transistor 470 will prevent an unselected local data line from being connected to VUB and, instead, cause the unselected local data line to float.

The output of NAND gate 484 is connected to the gate of transistor 480, the input of inverter 486 and the gate of transistor 488. The output of inverter 486 is connected to the gate of transistor 482. Transistor 488 is connected between local data line SELB[i+16] and transistor 490. Transistor 490 is connected between transistor 488 and the voltage VUB. The gate of transistor 470 receives the signal DSG_MODE from system control logic 130.

The output of NAND gate 524 is connected to the gate of transistor 520, the input of inverter 526 and the gate of transistor 528. The output of inverter 526 is connected to the gate of transistor 522. Transistor 528 is connected between local data line SELB[i+32] and transistor 530. Transistor 530 is connected between transistor 528 and the voltage VUB. The gate of transistor 530 receives the signal DSG_MODE from system control logic 130.

The output of NAND gate 544 is connected to the gate of transistor 540, the input of inverter 546 and the gate of transistor 548. The output of inverter 546 is connected to the gate of transistor 542. Transistor 48 is connected between local data line SELB[i+48] and transistor 550. Transistor 550 is connected between transistor 548 and the voltage VUB. The gate of transistor 550 receives the signal DSG_MODE from system control logic 130.

NAND gate 464 receives three inputs from system control logic 130: multiplexer select S[1], multiplexer select S[2], and EN. NAND gate 484 receives three inputs from system control logic 130: an inverted version of multiplexer selection signal S[1] (via inverter 493), multiplexer selection signal S[2], and EN. NAND gate 524 receives three inputs from system control logic 130: multiplexer selection signal S[1], an inverted version of multiplexer selection signal S[2] (via inverter 492), and EN. NAND gate 544 receives three inputs from system control logic 130: an inverted version of multiplexer selection signal S[1] (via inverter 493), an inverted version of multiplexer selection signal S[2] (via inverter 492), and EN. The signal EN] is normally set to 1 during a memory operation, but can be set to 0 to disable the multiplexer. EN may be used to disable the multiplexer when less than all global data lines will be used for simultaneous programming or the respective block is not selected for programming.

The circuits of FIGS. 9-13 can be used to implement the capacitive discharge method of programming discussed above. Two sets of circuit 300 of FIG. 10 will be used to concurrently connect two column of bit lines to the local data lines SELB[63:0] and SELB[127:64] (see FIG. 9). Circuits 302 of FIG. 13 are used to connect 16 of the 64 local data lines SELB[63:0] and 16 of the 64 of the local data lines SELB[127:64] to the circuit 302 of FIG. 12. The circuit 304 of FIG. 11 or 12 can connect either the selected 16 local data lines from SELB[63:0] or the selected 16 local data lines from SELB[127:64] to GSELB[15:0]. Once the above-described connections are made, sixteen sense amplifiers are in communication with sixteen memory cells via the global data lines, the selected local data line and the selected bit lines for the block. The 16 local data lines not connected to GSELB[15:0] receive the unselected bit line voltage. Additionally, the 16 local data lines not connected to GSELB[15:0] can be changed by changing portions of the column selected by multiplexer 302 or changing columns. By changing the columns associated with SELB[63:0] while a column associated with SELB[127:64] or another block is programmed, there is no time penalty for changing columns. Note that local data lines from another block are connected to GSELB[31:16] via similar circuits.

During a SET operation, the sense amplifiers will apply a voltage to the global data lines to charge up the global data lines due to the parasitic capacitance of the global data lines. When the multiplexers 302 and 304 (which are embodiments of a selection circuit) connect the local data lines to the global data lines, then the local data lines will also be charged up. When the selection circuits 300 (which are one embodiment of a selection circuit) connect the local data lines to a set of bit lines, sixteen of the bit lines will also be charged. Once a bit line is charged, the signals XCSEL[Z] and CSEL[Z] are toggled, which cuts off the bit line and leaves the bit line floating so that over time the bit line will discharge through the memory cell causing the memory cell to SET, as described above. Once the signals XCSEL[Z] and CSEL[Z] are toggled, the word line selection (discussed below) can change so that programming for the next word line will commence. The same connections can be used to perform a RESET operation.

Figure 14:
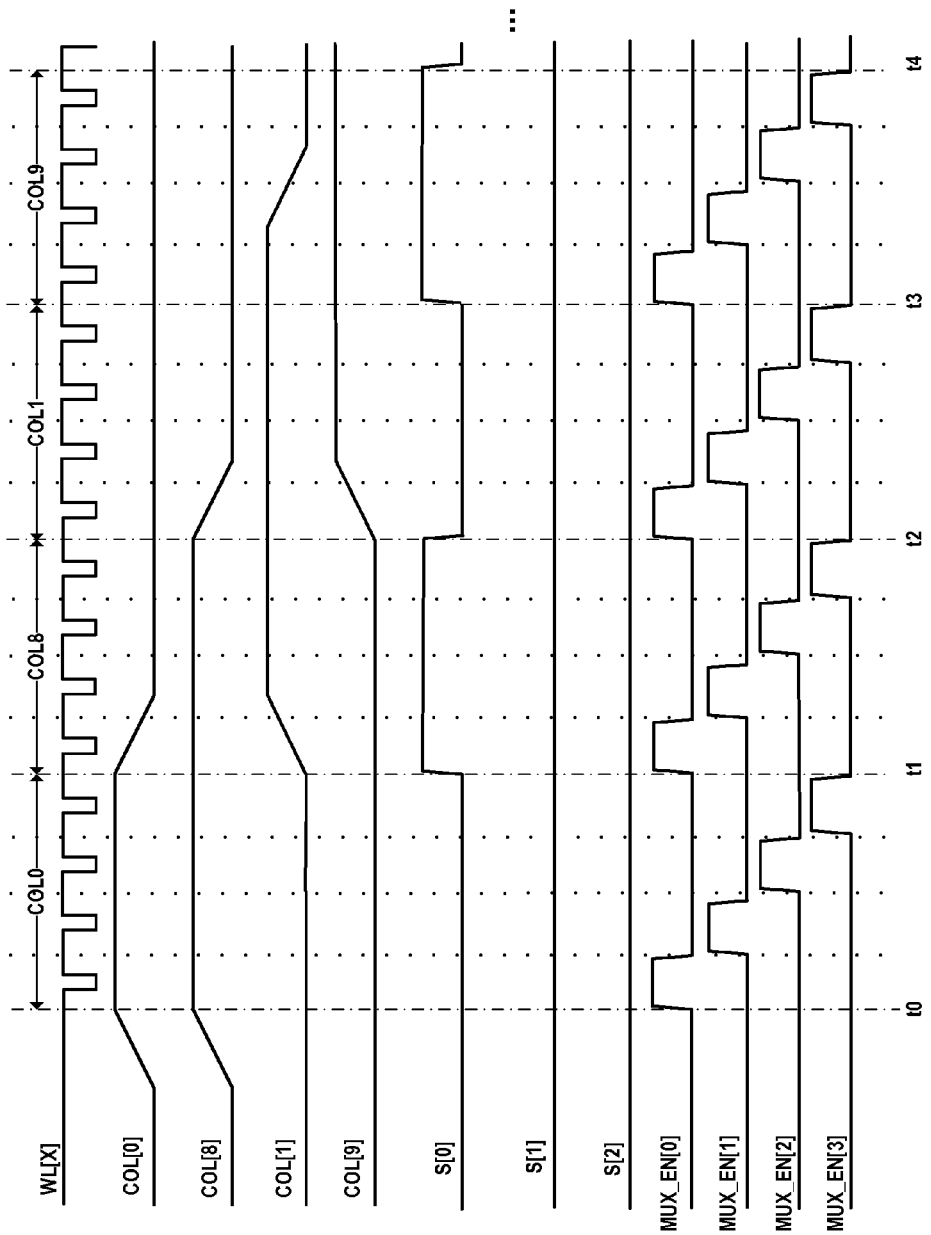
FIG. 14 is a timing diagram describing one embodiment of operation of a memory system.

FIG. 14 is a timing diagram depicting one embodiment of operating the structure FIG. 9. The timing diagram of FIG. 14 shows twelve signals: WL[X], COL[0], COL[8], COL[1], COL[9], S[0], S[1], S[2], MUX_EN[0], MUX_EN[1], MUX_EN[2], and MUX_EN[3]. The signal WL[X] represents a voltage on the selected word line. As can be seen, the signal starts at a high voltage and has a number of negative pulses. A negative pulse is defined by a signal that transitions from a high voltage to a low voltage, remains at the low voltage for a certain period of time, and then transitions back to the high voltage. The signal WL[X] has four negative pulses between t0 and t1, four negative pulses between t1 and t2, four negative pulses between t2 and t3, and four negative pulses between t3 and t4. During each negative pulse, a sense amplifier cycle is performed in which sixteen memory cells receive programming. In other embodiments, more or less than sixteen memory cells can be programmed during a sense amplifier cycle.

The signal COL[0] is the column enable signal for column 0. The signal COL[0] goes high for the period between t0 and t1 and then transitions to low. The signal COL[8] is the column enable signal for column 8. The signal COL[8] is high between t0 and t2, and then is low. The signal COL[1] is the column enable signal for column 1. The signal COL[1] is high between t1 and t3, and low otherwise. The signal COL[9] is the column enable signal for column 9. The signal COL[9] is high between t2 and t4 and then will lower after t4. Between t0 and t1, memory cells connected to column 0 are programmed. Between t1 and t2, memory cells connected to column 8 are programmed. Between t2 and t3, memory cells connected to column 1 are programmed. Between t3 and t4, memory cells connected to column 9 are programmed.

The multiplexor selection circuit S[0] causes the various 2:1 multiplexors 304 to select between the two groups of columns. This signal will toggle at each interval. Therefore, S[0] is low between t0 and t1, high between t1 and t2, low between t2 and t3, high between t3 and t4, etc. The multiplexor selection signals S[1] and S[2] cause the 4:1 multiplexors 302 to select a portion of a column pertaining to the page selected for programming. In the example of FIG. 14, both S[1] and S[2] remain low.

The signals MUX_EN[0], MUX_EN[1], MUX_EN[2], MUX_EN[3] are MUX enable signals for the 2:1 multiplexors 304. The signal MUX_EN[0] is the multiplexor enable signal for the top of the block depicted in FIG. 9. The signal MUX_EN[1] is the multiplexor enable signal for the top of the block next to the block depicted in FIG. 9 (refer to FIG. 9 as the "Other Block"). The signal MUX_EN[2] is the multiplexor enable signal for the bottom of the block depicted in FIG. 9. The signal MUX_EN[3] is the MUX enable signal for the bottom of the Other Block. During each column cycle (t0 to t1, t1 to t2, t2 to t3, t3 to t4, etc.), each MUX_EN signal will experience a pulse that coordinates with the sense amplifier cycle for the memory cells being connected to sense amplifiers through the respective multiplexor. Thus, during the column cycle of t0 to t1, there are pulses for each of the four multiplex enable signals with one pulse for each signal. The first pulse is from MUX_EN[0] which causes 16 of the bit lines connected to column 0 to receive programming. The second pulse in the column cycle is for MUX_EN[1] to enable sixteen memory cells for column 0 of the Other Block to receive programming. The third pulse is experienced by MUX_EN[2] for enabling sixteen memory cells connected to column 0 at the bottom side of the block depicted in FIG. 9 to receive programming. The fourth pulse for MUX_EN[3] enables sixteen memory cells in the Other Block connected to column 0 at the bottom side to receive programming. When a corresponding MUX_EN[i] signal is high, the receiving multiplexor 304 will enable communication between the global data lines (e.g., GSELT[i]) and the local data lines (e.g., SELB[x]).

As can be seen from the timing diagram of FIG. 14, between t0 and t1, memory cells connected to column 0 for two blocks are programmed. Between time t1 and t2, memory cells connected to column 8 for two blocks are programmed. While programming the memory cells of column 8, column 0 is disconnected from 4:1 multiplexors 302 and column 1 is connected to multiplexors 302 in its place. Between t2 and t3, column 1 is programmed. While column 1 is being programmed, column 8 is disconnected from multiplexors 302 and column 9 is connected to the appropriate multiplexors 302 to replace column 8. This is performed by using the selection circuits 300 to disconnect column 8 and connect column 9. Because one column is changed for another column while a different column is being programmed, there is no overhead time for changing columns. This makes the programming process more efficient.

Figure 15:
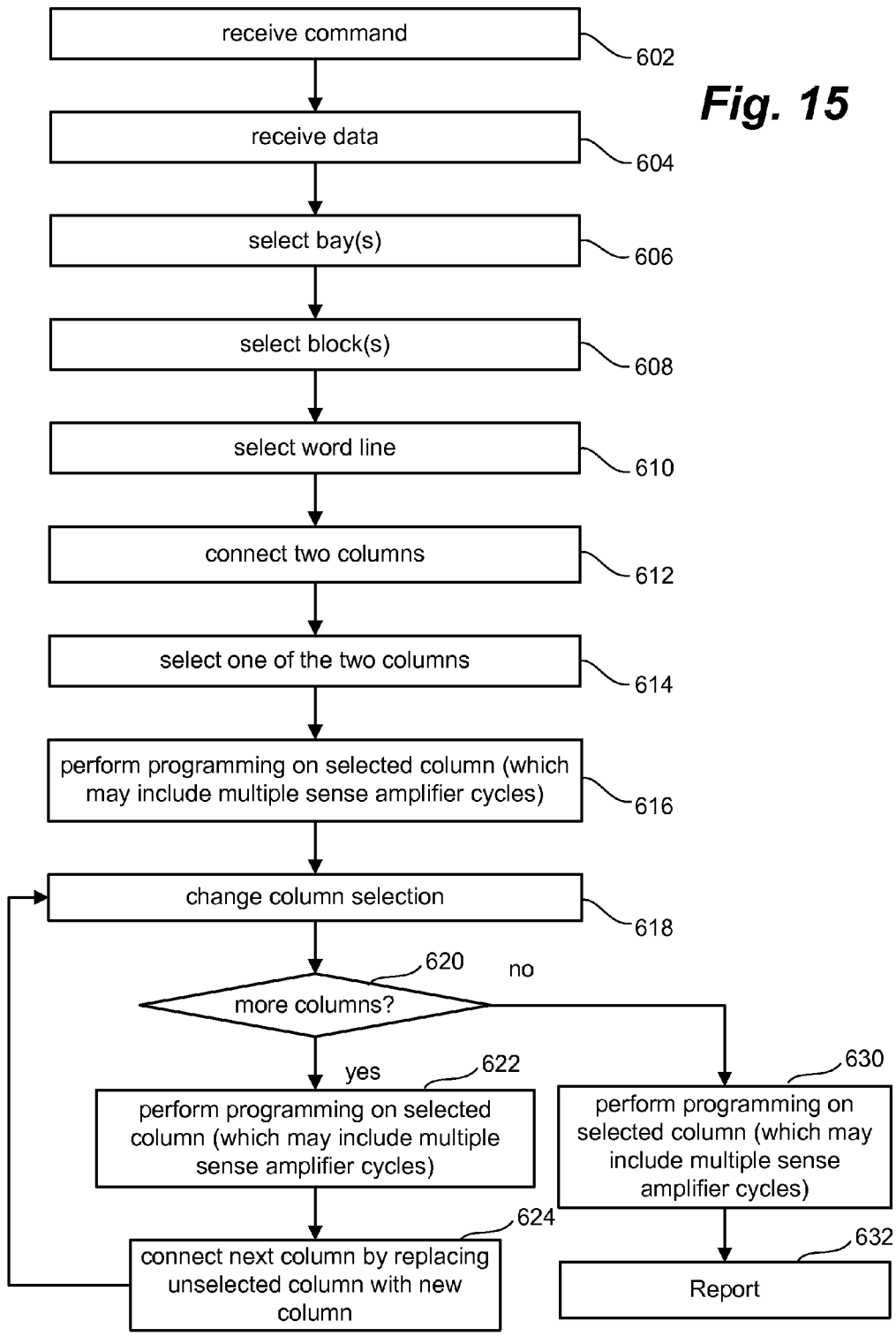
FIG. 15 is a flow chart describing one embodiment of operation of a memory system.

FIG. 15 is a flow chart describing one embodiment for operating the structure of FIG. 9. In step 602, system control logic 130 receives a command from controller 134 or the host to program data. The data to be programmed is received by system control logic 130 in step 604. In step 606, one or more bays are selected for programming the data. In step 608, one or more blocks within a selected bay(s) are selected for programming. In step 610, a word line in the selected blocks is selected for programming. In some embodiments, multiple word lines will be selected and a programming process will be performed on multiple word lines. In step 612, two columns in the selected blocks are concurrently connected to the local data lines. For example, column 0 and column 8 of FIG. 9 can be selected and connected to the local data lines. The two columns are selected such that one column from a first group is selected and one column from the second group is selected, where the two groups are individually connected to their own set of 4:1 multiplexors 302. The two columns are connected concurrently such that there will be a period of time when both are connected; however, it is possible that the two columns will commence connection at different times and complete connection at different times.

In step 614, one of the two connected columns is then selected. For example, multiplexor 304 will be used to select one of the two columns for connection to the global data line. The non-selected column will receive the unselected bit line voltage. In step 616, programming is performed on all or a selected portion of the selected column that is in communication with the global data lines. The programming can include multiple sense amplifier cycles, as discussed above. In step 618, the selection between the two columns is changed. For example, multiplexor 304 will change its selection. In step 620, it will be determined whether any more columns will need to be programmed for the block. If so, then in step 622 programming is performed on the newly selected column (which may include multiple sense amplifier cycles). In step 624, a new column will be connected by replacing the unselected column with the new column. For example, while programming column 8, column 0 will be disconnected and column 1 will be connected in its place. After step 624, the process loops back to step 618, during which the column selection of multiplexor 304 is changed. This process will continue until programming of the last column is selected (step 620), in which case the process will continue at step 630 and perform programming on the last column (which may include multiple sense amplifier cycles). After programming the last column, system control logic 130 will report to controller 134 and/or the host about the success or failure of the programming operation. Note that the timing diagram of FIG. 14 corresponds to step 612-624 of FIG. 15.

Figure 16:
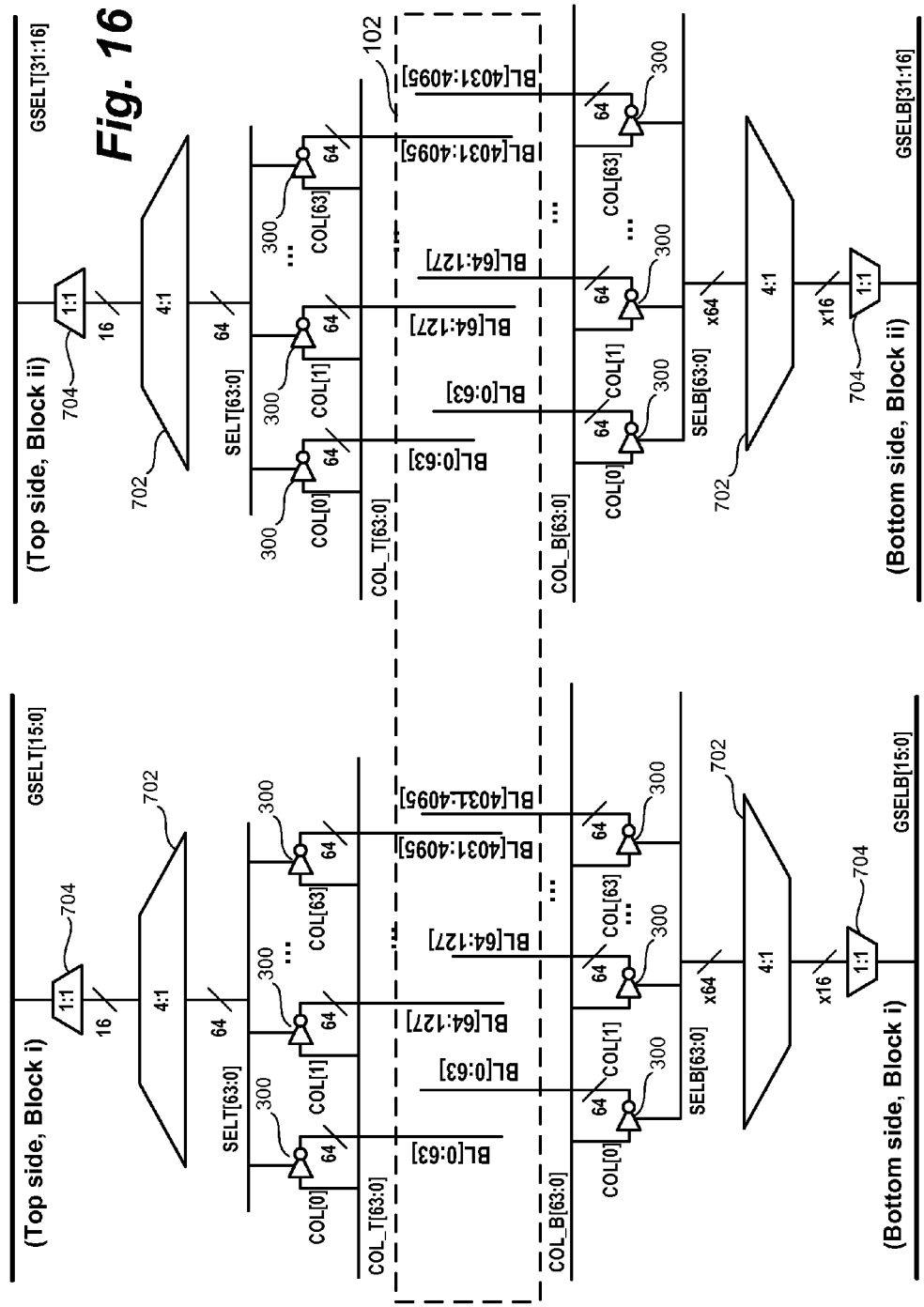
FIG. 16 is a schematic diagram of one embodiment of the data lines and selection circuits for two blocks of memory cells.

FIG. 16 discloses another embodiment of a memory system with a different architecture for some of the selection circuits and data lines. FIG. 16 shows two blocks: Block i and Block ii. Both blocks include memory cells within memory array 102; however, the memory cells are not depicted to make the diagram simpler to read. Each of the blocks includes word lines such as the sixteen word lines depicted in FIG. 9; however, the word lines are not depicted to make the drawing easier to read. As in FIG. 9, the bit lines are grouped into columns of bit lines and individual columns of bit lines are connected to local data lines by selection circuits 300. Selection circuits 300 are also controlled by the same global column decoders 310 of FIG. 9; however, the global column decoders are not depicted in FIG. 16 to make it easier to read. In the embodiment of FIG. 16, each block includes a set of local data lines on the top side SELT[63:0] and a set of local data lines on the bottom side of the block SELB[63:0]. Selection circuits 300 are used to connect a column of 64 bit lines to the local data lines.

The local data lines (SELT[63:0] and SELB[63:0]) are connected to a set of sixteen 4:1 multiplexors 702. There is a set of sixteen multiplexors 702 on the top side of a block and a set of sixteen multiplexors 702 on the bottom side of the block, for each block. The output of the sixteen 4:1 multiplexor 702 are sixteen bits that are connected to a driver circuit 704. The purpose of 4:1 multiplexors 702 is to select sixteen of the sixty four bits of the column connected to the local data lines. In one embodiment, a given page of data persists on sixteen bit lines for each column; therefore, only sixteen bit lines of each column need to be connected to sense amplifiers when programming a page of data. In that same embodiment, a page of data will include sixteen bit lines on sixteen columns for two blocks in a bay. The page can also go across multiple bays. Thus, selection circuits 300 select one column for the local data lines (bottom and/or top). The multiplexors 702 select a portion of each column. That portion (sixteen bits) is provided to driver circuit 704. In one embodiment, 4:1 multiplexor 702 is implemented using the structure of FIG. 13.

Driver circuit 704 connects that portion to the appropriate bits of the global data lines. In one embodiment, there are sixty four global data lines for a bay, with each global data line being connected to one sense amplifier for the bay. The global data lines include top global data lines GSELT[31:0] and bottom global data lines GSELB[31:0]. Sixteen bits output from driver circuits 704 on the top side of each block are connected to the top side global data lines and sixteen bits output from driver circuits 704 on the bottom side of each block are connected to the bottom side global data lines. For example, driver circuits 704 for the top side of block i will enable sixteen bits for the top side of Block i to be connected to GSELT[15:0]. Driver circuit 704 for top side of Block ii will enable sixteen bits from the top side of Block ii to be connected to GSELT[31:16]. Driver circuit 704 for the bottom side of Block i will enable sixteen bits from the bottom side of Block i to be connected to GSELB[15:0]. Driver circuit 704 for the bottom side of Block ii will enable sixteen bits from the bottom side of Block ii to be connected to GSELB[31:16]. Driver circuit 704 selectively connects the inputs to the driver circuits to the appropriate global data lines. Alternatively, driver circuits 704 can float their output so that the selected bit lines will not be in communication with the global data line (but receive the unselected bit line voltage instead). As discussed above, there are 64 blocks in a bay; however, in this embodiment only two blocks can be connected to set of global data lines for a bay at a time.

Figure 17:
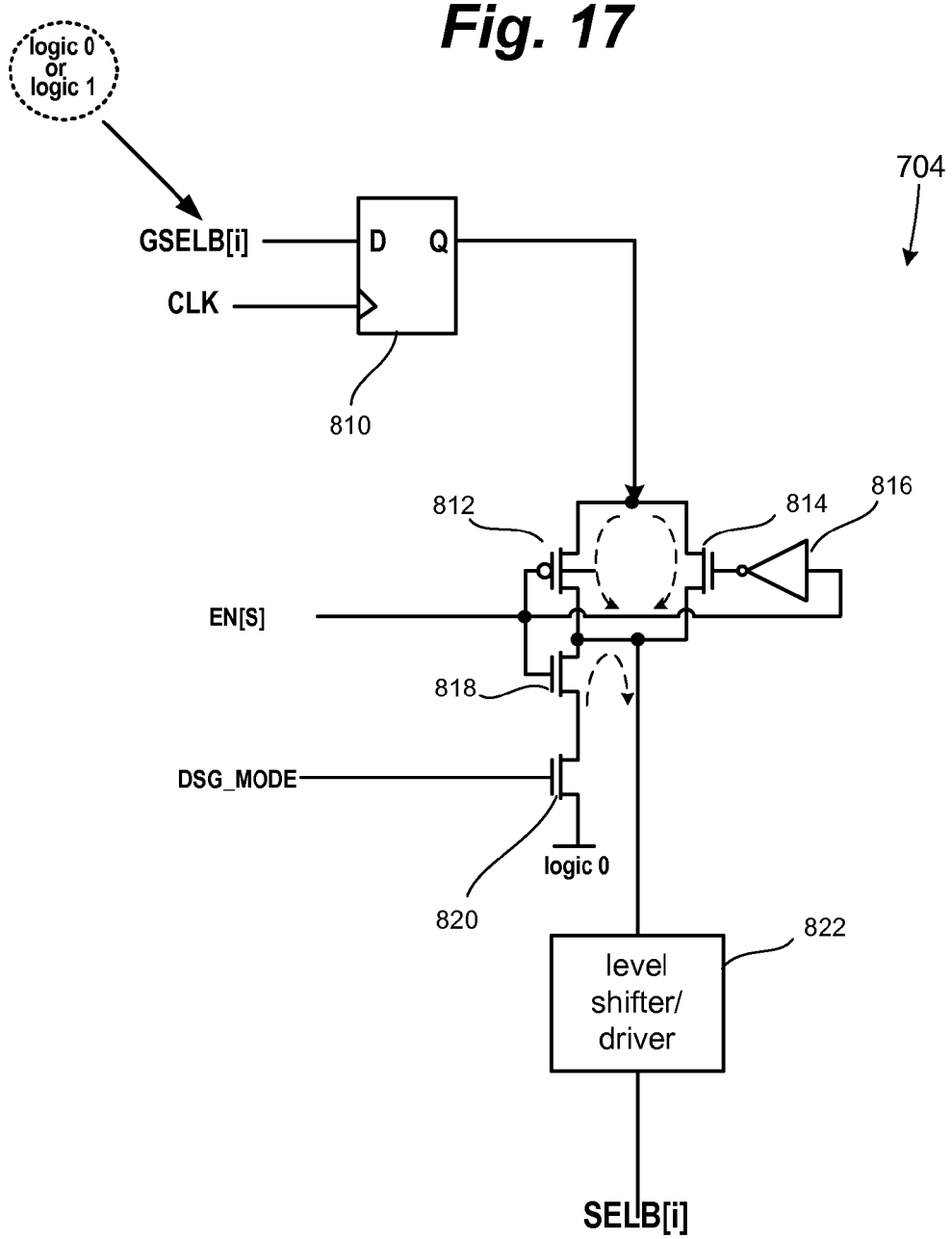
FIG. 17 is a schematic diagram of one embodiment of a circuit that provides selective communication between a global data line and a local data line.

FIG. 17 is a schematic diagram of one example implementation of a driver circuit 704. The D input of the flip flop 810 is connected to the respective global data line GSELB[i]. D flip flop 810 also includes a clock input. The output of D flip flop 810 is connected to transistor 812 and transistor 814. Signal EN[S], an enable signal, is connected to the gate of transistor 812 and the input to inverter 816. The output of inverter 816 is connected to the gate of transistor 814. Transistors 812 and 814 are also connected to transistor 818 and level shifter 822. Transistor 818 is also connected to transistor 820. The gate of transistor 820 receives a signal DSG_MODE (explained above). The other side of transistor 820 is connected to a voltage associated with logic 0. Level shifter/driver 822 operates the same way the level shifters operate as described above with respect to FIG. 12. In operation, data for the current cycle is stored in D flip flop 810. If enable signal EN[S] is logic high, the output of D flip flop 810 is provided to the level shifter 822. The Q output of the D flip flop can be either logic 1 or logic 0. If EN[S] is at logic 0, then level shifter 822 receives logic 0 from transistor 820. In this embodiment, the sense amplifier will either drive the voltage associated with logic 0 (e.g. 0 volts) or a voltage associated with logic 1 (e.g. 3 volts). If level shifter/driver 822 receives a logic 0, the output of level shifter/driver 822 onto SELB[I] will be the unselected bit line voltage. If level shifter/driver 822 receives a logic 1, the output of level shifter/driver 822 onto SELB[I] will be the programming voltage.

Figure 18:
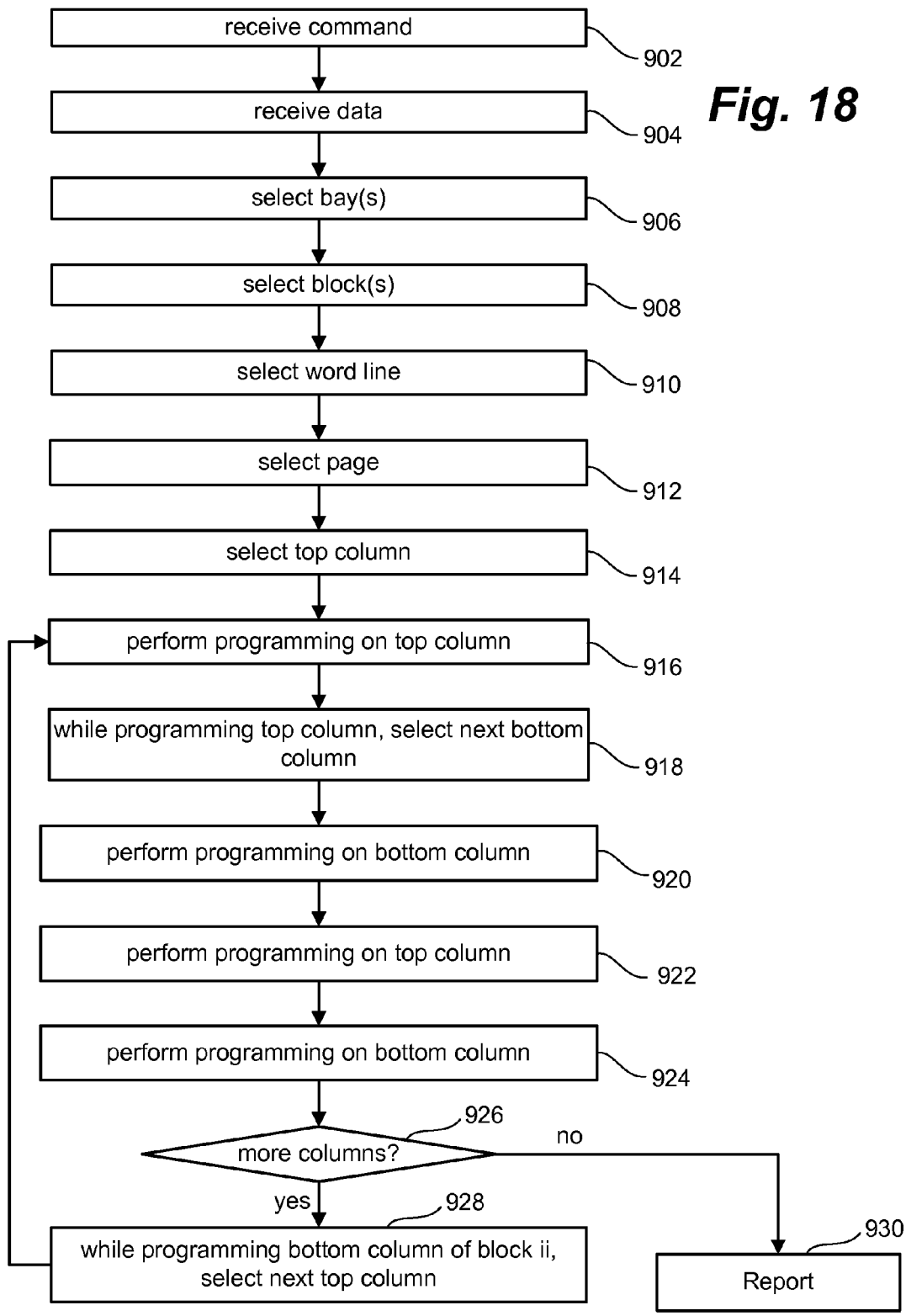
FIG. 18 is a flow chart describing one embodiment of operation of a memory system.

FIG. 18 is a flow chart describing one embodiment of the operation of the structure of FIG. 16. In step 902, system control logic 130 receives a command to program data. This command can be received from controller 134 or the host. In step 904, data for the programming command is received at system control logic 130. In step 906, system control logic 130 will select one or more bays to program a page of data. In step 908, one or more blocks in the selected one or more bays is selected. In step 910, one word line for programming will be selected. In some embodiments, a page of data can be across more than one word line and, therefore, more than one word line will be selected. In step 912, the page is selected. For example, sixteen of the sixty four bit lines of a column can be selected for a particular page. In step 914, a top column is selected. As depicted in FIG. 16, selection circuits 300 will select one top column to connect to SELT[63:0]. As the column decoders are global for a strip or bay, step 914 includes selecting a top column for all blocks in a stripe or bay.

In step 916, the system will perform programming on a top column for one or more blocks. In one embodiment, sixteen selected bit lines for Block i are connected to GSELT[15:0] and sixteen selected bit lines for Block ii are connected to GSELT[31:16] so that the sixteen bits for Block i and the sixteen bits for Block i are programmed during step 916. In a first set of embodiments, all thirty two bits are programmed simultaneously. In a second set of embodiments, the programming of the thirty two bits is performed over multiple sense amplifier cycles. In one example implementation, each sense amplifier cycle include programming eight bits from one block and eight bits from another block. Thus, in this example implementation, step 916 includes programming GSELT[7:0] and GSELT[23:16] at the same time.

While programming the top column, the next bottom column is selected and connected in step 918. As the column decoders are global for a stripe or bay, step 918 includes selecting a bottom column for all blocks in a stripe or bay. In step 920, programming will be performed for the bottom column. In one example implementation, step 920 includes programming GSELB[7:0] and GSELB[23:16] at the same time. In step 922, programming will be performed for the top column. In one example implementation, step 922 includes programming GSELT[15:8] and GSELT[31:24] at the same time. In step 924, programming will be performed for the bottom column. In one example implementation, step 924 includes programming GSELB[15:8] and GSELB[31:24] at the same time. In step 926, it is determined whether there are any more columns to program. If there are more columns to program, then in step 928 the next column on the top side will be selected. The new top side column will be selected while programming the bottom column in step 924. That is, step 928 will be performed while performing step 924, just like step 918 is performed while performing step 916. After step 928, the process loops back to step 916 and repeats. When there are no more columns to program (step 926), then system control logic 130 will report whether the programming process was a success or a failure.

Figure 19:
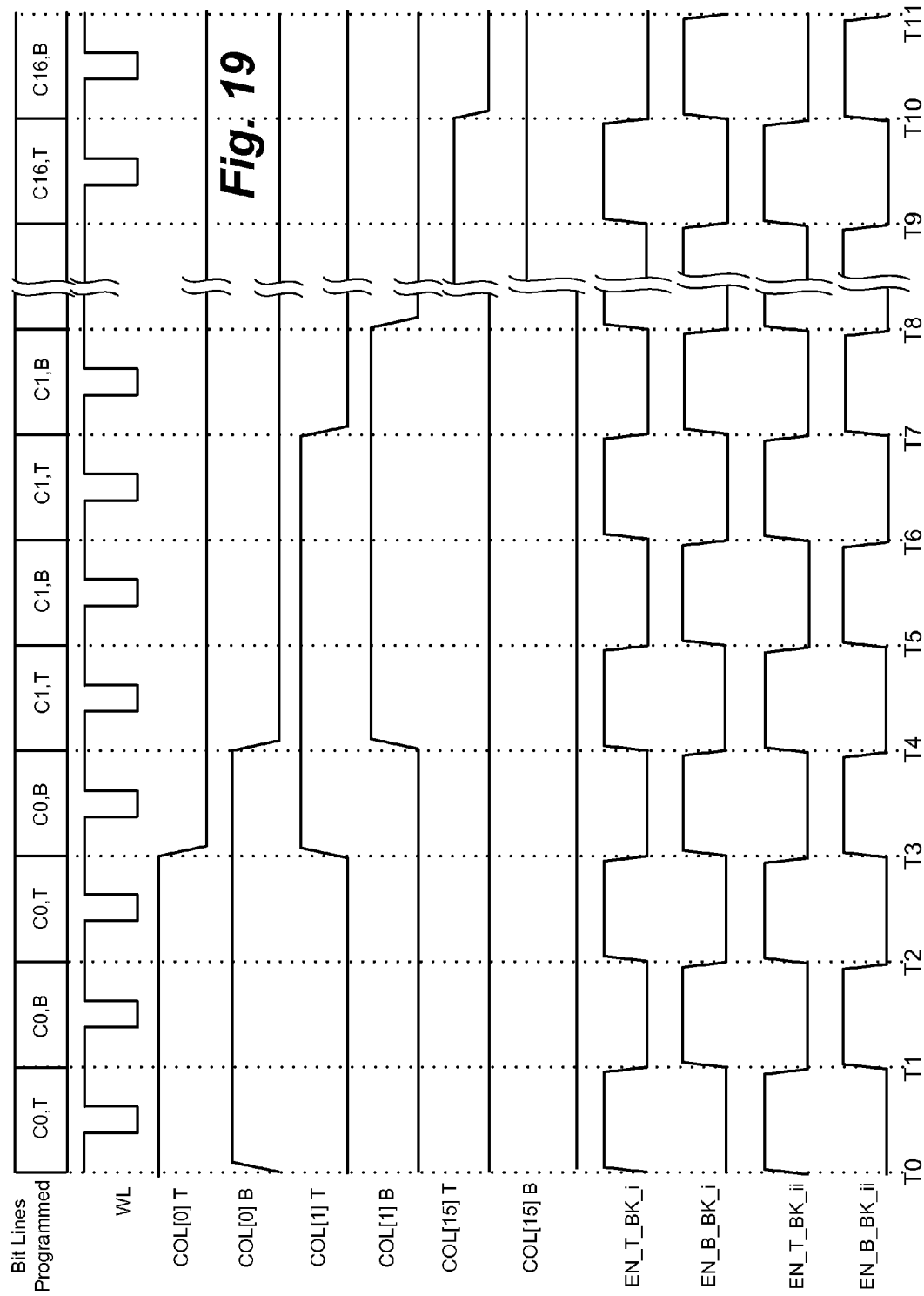
FIG. 19 is a timing diagram that explains the operation of a memory system.

FIG. 19 is a timing diagram depicting the operation of the structure of FIG. 16 during steps 914-928. FIG. 19 shows the behavior of the following signals: WL, COL[0]T, COL[0]B, COL[1]T, COMM, COL[15]T, COL[15]B, EN_T_BK_i, EN_B_BK_i, EN_T_BK_ii, and EN_B_BK_ii. The top line of FIG. 19 indicates which bit lines are being programmed. For example, between T0 and T1, programming is provided to the memory cells connected to the bit lines of column 0 on the top side of Block i and Block ii. One example, includes programming GSELT[7:0] and GSELT[23:16] at the same time. Between T1 and T2, programming is provided to the memory cells connected to the bit lines of column 0 on the bottom side of Block i and Block ii. One example, includes programming GSELB[7:0] and GSELB[23:16] at the same time. Between T2 and T3, programming is provided to the memory cells connected to the bit lines of column 0 on the top side of Block i and Block ii. One example, includes programming GSELT[15:8] and GSELT[31:24] at the same time. Between T3 and T4, programming is provided to the memory cells connected to the bit lines of column 0 on the bottom side of Block i and Block ii. One example, includes programming GSELB[15:8] and GSELB[31:24] at the same time. Between T4 and T5, programming is provided to the memory cells connected to the bit lines of column 1 on the top side of Block i and Block ii. Between T5 and T6, programming is provided to the memory cells connected to the bit lines of column 1 on the bottom side of Block i and Block ii. Between T6 and T7, programming is provided to the memory cells connected to the bit lines of column 1 on the top side of Block i and Block ii. Between T7 and T8, programming is provided to the memory cells connected to the bit lines of column 1 on the bottom side of Block i and Block ii, and so on. The signal WL represents the voltage on the selected word line. The signal WL indicates a negative pulse to the word line when the memory cells connected to that word line are being programmed.

The signal COL[0]T is the column enable signal for the top side column 0 for both blocks i and ii. The signal COL[0]B is the column enable signal for the bottom side column 0 for both blocks i and ii. The signal COL[1]T is the column enable for top side column 1 for both blocks i and ii. The signal COL[1]B is the column enable for bottom side column 1 for both blocks i and ii. The signal COL[15]T is the column enable for top side column 15 for both blocks i and ii. The signal COL[15]B is the column enable for bottom side column 15 for both blocks i and ii.

The signal COL[0]T is logic one (enabled) between T0 and T3. The signal COL[0]B is logic one between T0 and T4. The signal COL[1]T is logic one between T3 and T7. The signal COL[1]B is logic one between T4 and T8. As can be seen, column 0 on the top side is enabled between T0 and T3, column 0 on the bottom side is enabled between T0 and T4. While column 0 on the bottom side is enabled, the top side is switched from column 0 to column 1 at T3. While column 1 on the top side is enabled, the bottom side is switched from column 0 to column 1. This process repeats itself.

Each of the enabled signals EN_T_BK_i, EN_B_BK_i, EN_T_BK_ii, and EN_B_BK_ii are pulsed high in successive cycles to enable the respective set of sixteen bit lines to receive programming. The signal EN_T_BK_i corresponds to the enable signal for drivers 704 for the top side Block i. The signal EN_B_BK_i corresponds to the enable signal for drivers 704 for the bottom side of Block i. The signal EN_T_BK_ii corresponds to the enable signal for drivers 704 for the top side of Block ii. The signal EN_B_BK_ii corresponds to the enable signal for drivers 704 for the bottom side of Block ii. The signals EN_T_BK_i and EN_T_BK_ii are pulsed between T0 and T1, T2 and T3, T4 and T5, T6 and T7, etc. The signals EN_B_BK_i and EN_T_BK-ii are pulsed between T1 and T2, T3 and T4, T5 and T6, T7 and T8, etc. When the appropriate enable signal is pulsed high, the bits for the corresponding driver circuits can 704 receive programming.

One embodiment includes a monolithic three dimensional array of non-volatile storage elements arranged in blocks, a plurality of word lines connected to the non-volatile storage elements, a plurality of bit lines connected to the non-volatile storage elements such that the bit lines are grouped into columns of bit lines and each block has multiple columns of bit lines, row decoders connected to the word lines, one or more signal sources, first selection circuits and second selection circuits such that the first selection circuits selectively connect columns of bit lines to the second selection circuits and the second selection circuits connects bit lines to the one or more signal sources, global column decoders in communication with and controlling the first selection circuits such that each global column decoder selects corresponding columns of bit lines for multiple blocks of non-volatile storage elements, and a control circuit in communication with the row decoders and the global column decoders to concurrently select two columns of bit lines per selected block to be in communication with the second selection circuits. The control circuit is in communication with the one or more signal sources and the second selection circuits to allow one of two columns of bit lines at a time to be programmed by the one or more signal sources. The first selection circuits switch one of two columns of bit lines connected to the second selection circuits while another column is being programmed.

One embodiment includes a cross point monolithic three dimensional array of non-volatile storage elements arranged in blocks, a plurality of word lines connected to the non-volatile storage elements, a plurality of bit lines connected to the non-volatile storage elements such that the bit lines are grouped into columns and each block has multiple columns of bit lines, a first set of one or more selection circuits that selects at least a portion of one column of bit lines for a first block, a second set of one or more selection circuits that selects at least a portion of one column of bit lines for the first block while the first set of one or more selection circuits selects at least a portion of one column of bit lines for the first block, and one or more control circuits in communication with the first set of one or more selection circuits and the second set of one or more selection circuits to perform programming by alternating programming between the columns of bit lines for the first block selected by the first set of one or more selection circuits and columns of bit lines for the first block selected by the second set of one or more selection circuits. The first set of one or more selection circuits changes column selection during programming of a column of bit lines selected by the second set of one or more selection circuits. The second set of one or more selection circuits changes column selection during programming of a column of bit lines selected by the first set of one or more selection circuits. The first set of one or more selection circuits selects different columns than the second set of one or more selection circuits One embodiment includes selectively connecting two columns of bit lines, from a group of four or more columns of bit lines for a block, to a set of one or more selection circuits, using the one or more selection circuits to selectively connect one of the two columns of bit lines to one or more signal sources while preventing the other column of the two columns of bit lines from being connected to the one or more signal sources, programming non-volatile storage elements for the column of bit lines that is currently connected to the one or more signal sources, and changing one of the columns of bit lines connected to the set of one or more selection circuits while another column of bit lines is being programmed.

One embodiment includes method for programming a monolithic three dimensional array of non-volatile storage elements arranged in blocks. The non-volatile storage elements are connected to bit lines and word lines. The method comprises (a) concurrently connecting to two columns of bit lines of a particular block, (b) selecting one of the two connected columns of bit lines, (c) performing programming on the selected column of bit lines, (d) selecting a different connected column, (e) performing programming on the selected column of bit lines, (f) changing the connection of columns of bit lines while performing step (e) by disconnecting the connected column of bit lines not being programmed and connecting to a new column of bit lines of the particular block, and (g) repeating steps (d)-(g) multiple times.

One embodiment includes a method for programming a monolithic three dimensional array of non-volatile storage elements arranged in blocks. The non-volatile storage elements are connected to bit lines and word lines. The bit lines for each block are grouped into top columns of bit lines that are connected to selection circuits on a top side of a respective block and bottom columns of bit lines that are connected to selection circuits on a bottom side of the respective block. The method comprises programming top columns of bit lines and bottom columns of bit lines such that programming alternates between top columns of bit lines and bottom columns of bit lines, selecting new top columns of bit lines when bottom columns of bit lines are programming, and selecting new bottom columns of bit lines when top columns of bit lines are programming.

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage apparatus, comprising:
a monolithic three dimensional array of non-volatile storage elements arranged in blocks;
a plurality of word lines connected to the non-volatile storage elements;
a plurality of bit lines connected to the non-volatile storage elements, the bit lines are grouped into columns of bit lines, each block has multiple columns of bit lines;
row decoders connected to the word lines;
one or more signal sources;
first selection circuits and second selection circuits, the first selection circuits selectively connect columns of bit lines to the second selection circuits, the second selection circuits connects bit lines to the one or more signal sources;
global column decoders in communication with and controlling the first selection circuits, each global column decoder selects corresponding columns of bit lines for multiple blocks of non-volatile storage elements; and
a control circuit in communication with the row decoders and the global column decoders to concurrently select two columns of bit lines per selected block to be in communication with the second selection circuits, the control circuit is in communication with the one or more signal sources and the second selection circuits to allow one of two columns of bit lines at a time to be programmed by the one or more signal sources, the first selection circuits switch one of two columns of bit lines connected to the second selection circuits while another column is being programmed.

2. The non-volatile storage apparatus of claim 1, wherein:
the row decoders are positioned underneath the array of non-volatile storage elements; and
the global column decoders are arranged outside the array of non-volatile storage elements.

3. The non-volatile storage apparatus of claim 1, further comprising:
a first set of data lines connected to a first subset of the first selection circuits and the second selection circuits, the first subset of the first selection circuits connect a first selected column of bit lines to the first set of data lines;
a second set of data lines connected to a second subset of the first selection circuits and the second selection circuits, the second subset of the first selection circuits connect a second selected column of bit lines to the second set of data lines, the first selected column of bit lines and the second selected column of bit lines are in the same block; and
a third set of data lines connected to the second selection circuits and the one or more signal sources, the second selection circuits put the one or more signal sources in communication with either the first selected column of bit lines or the second selected column of bit lines.

4. The non-volatile storage apparatus of claim 3, wherein:
the second selection circuits include a first level of multiplexers connected to a second level of multiplexers, the first level of multiplexers are connected to the first set of data lines and the second set of data lines, the first level of multiplexers choose a portion of each selected column, the second level of multiplexers choose the one of two columns of bit lines to be programmed by the one or more signal sources.

5. The non-volatile storage apparatus of claim 1, wherein:
the first selection circuits connect to all columns of bit lines in a block;
the first selection circuits connect two columns of bit lines in the block to the second selection circuits; and
the first selection circuits connect unselected columns of bit lines in the block to an unselected bit line voltage.

6. The non-volatile storage apparatus of claim 1, further comprising:
global data lines connectable to the multiple blocks, the second selection circuits select bit lines for a first block to be connected to a first portion of the global data lines and concurrently select bit lines for a second block to be connected to a second portion of the global data lines.

7. The non-volatile storage apparatus of claim 1, wherein:
the bit lines for each block are grouped into top side columns of bit lines that are connected to first selection circuits on a top side of the respective block and bottom side columns of bit lines that are connected to first selection circuits on a bottom side of the respective block; and
the non-volatile storage apparatus further comprises:
a first set of data lines connected to first selection circuits on the top side and second selection circuits on the top side, the first selection circuits on the top side connect a first selected top side column of bit lines to the first set of data lines;
a second set of data lines connected to the second selection circuits on the top side and a first subset of the one or more signal sources;
a third set of data lines connected to first selection circuits on the bottom side and second selection circuits on the bottom side, the first selection circuits on the bottom side connect a first selected bottom side column of bit lines to the third set of data lines; and
a fourth set of data lines connected to the second selection circuits on the bottom side and a second subset of the one or more signal sources.

8. The non-volatile storage apparatus of claim 1, wherein:
the second selection circuits include a set of multiplexer circuits that select a portion of a selected column and additional selection circuits; and
the additional selection circuits each include a storage device, a switch and a level shifter.

9. The non-volatile storage apparatus of claim 1, wherein:
the monolithic three dimensional array of non-volatile storage elements is a cross point array; and
the non-volatile storage elements each include a reversible resistance-switching element in series with a steering device.

10. A non-volatile storage apparatus, comprising:
a cross point monolithic three dimensional array of non-volatile storage elements arranged in blocks;
a plurality of word lines connected to the non-volatile storage elements;
a plurality of bit lines connected to the non-volatile storage elements, the bit lines are grouped into columns, each block has multiple columns of bit lines;
a first set of one or more selection circuits that selects at least a portion of one column of bit lines for a first block;
a second set of one or more selection circuits that selects at least a portion of one column of bit lines for the first block while the first set of one or more selection circuits selects at least a portion of one column of bit lines for the first block, the first set of one or more selection circuits selects different columns than the second set of one or more selection circuits; and
one or more control circuits in communication with the first set of one or more selection circuits and the second set of one or more selection circuits to perform programming by alternating programming between the columns of bit lines for the first block selected by the first set of one or more selection circuits and columns of bit lines for the first block selected by the second set of one or more selection circuits, the first set of one or more selection circuits changes column selection during programming of a column of bit lines selected by the second set of one or more selection circuits, the second set of one or more selection circuits changes column selection during programming of a column of bit lines selected by the first set of one or more selection circuits.

11. The non-volatile storage apparatus of claim 10, further comprising:
a third set of one or more selection circuits in communication with the first set of one or more selection circuits and the second set of one or more selection circuits;
data lines connected to the third set of one or more selection circuits; and
one or more signal sources connected to the data lines and the one or more control circuits, the one or more signal sources provide a programming voltage.

12. The non-volatile storage apparatus of claim 10, wherein:
the bit lines for each block are grouped into top side columns of bit lines and bottom side columns of bit lines;
the first set of one or more selection circuits are connected to the top side columns on a top side of a respective block; and the second set of one or more selection circuits are connected to the bottom side columns on a bottom side of the respective block.

13. The non-volatile storage apparatus of claim 10, wherein:
the one or more control circuits include column decoders outside the array; and
the column decoders are in communication with and controlling the set of one or more selection circuits, each column decoder circuit selects corresponding columns of bit lines for multiple blocks of non-volatile storage elements.

14. The non-volatile storage apparatus of claim 10, wherein:
the non-volatile storage elements each include a reversible resistance-switching element in series with a steering device.

15. A method for programming non-volatile storage, comprising:
selectively connecting two columns of bit lines, from a group of four or more columns of bit lines for a block, to a set of one or more selection circuits;
using the one or more selection circuits to selectively connect one of the two columns of bit lines to one or more signal sources while preventing the other column of the two columns of bit lines from being connected to the one or more signal sources;
programming non-volatile storage elements for the column of bit lines that is currently connected to the one or more signal sources; and
changing one of the columns of bit lines connected to the set of one or more selection circuits while another column of bit lines is being programmed.

16. The method of claim 15, wherein:
the group of four or more columns of bit lines includes top side columns of bit lines and bottom side columns of bit lines, the top side columns of bit lines are connected to selection circuits on a top side of the block, the bottom side columns of bit lines are connected to selection circuits on a bottom side of the block; and
the connected two columns of bit lines includes one top side column of bit lines and one bottom side column of bit lines.

17. The method of claim 15, wherein:
the group of four or more columns of bit lines include top side columns of bit lines and bottom side columns of bit lines, the top side columns of bit lines are connected to selection circuits on a top side of the block of non-volatile storage elements, the bottom side columns of bit lines are connected to selection circuits on a bottom side of the block of non-volatile storage elements; and
the connected two columns of bit lines includes a first top side column of bit lines for the respective block and a second top side column of bit lines for the block.

18. The method of claim 15, wherein the programming non-volatile storage elements for the column of bit lines that is currently connected to the one or more signal sources comprises:
switching resistance of non-volatile storage elements in a cross point monolithic three dimensional array of non-volatile storage elements.

19. A method for programming a monolithic three dimensional array of non-volatile storage elements arranged in blocks, the non-volatile storage elements are connected to bit lines and word lines, the method comprising:
(a) concurrently connecting to two columns of bit lines of a particular block;
(b) selecting one of the two connected columns of bit lines;
(c) performing programming on the selected column of bit lines;
(d) selecting a different connected column;
(e) performing programming on the selected column of bit lines;
(f) changing the connection of columns of bit lines while performing step (e) by disconnecting the connected column of bit lines not being programmed and connecting to a new column of bit lines of the particular block; and
(g) repeating steps (d)-(g) multiple times.

20. The method of claim 19, further comprising:
performing steps (a)-(g) for an additional block concurrently with performing steps (a)-(g) for the particular block, the particular block and the additional block are connected to a common column decoder.

21. The method of claim 19, wherein:
step (c) performing programming on the selected column of bit lines comprises changing resistance of reversible resistance-switching elements of memory cells connected to the selected columns of bit lines.

22. A method for programming a monolithic three dimensional array of non-volatile storage elements arranged in blocks, the non-volatile storage elements are connected to bit lines and word lines, the bit lines for each block are grouped into top columns of bit lines that are connected to selection circuits on a top side of a respective block and bottom columns of bit lines that are connected to selection circuits on a bottom side of the respective block, the method comprising:
programming top columns of bit lines and bottom columns of bit lines such that programming alternates between top columns of bit lines and bottom columns of bit lines;
selecting new top columns of bit lines when bottom columns of bit lines are programming; and
selecting new bottom columns of bit lines when top columns of bit lines are programming.

23. The method of claim 22, wherein:
the programming top columns of bit lines and bottom columns of bit lines includes programming top columns of bit lines for two blocks and bottom columns of bit lines for the two blocks; and
programming top columns of bit lines for the two blocks comprises changing resistance of reversible resistance-switching elements of memory cells connected to the top columns of bit lines for the two blocks.

24. The method of claim 22, wherein:
the selecting new bottom columns of bit lines includes selecting one new bottom column of bit lines for a particular block while one top column of bit lines for the particular block is experiencing programming.

* * * * *